(12) United States Patent  (10) Patent No.: US 8,072,572 B2
Hirakata et al.  (45) Date of Patent: Dec. 6, 2011

(54) SUBSTRATE FOR A DISPLAY PANEL, A DISPLAY PANEL HAVING THE SUBSTRATE, A PRODUCTION PROCESS OF THE SUBSTRATE, AND A PRODUCTION PROCESS OF THE DISPLAY PANEL

(75) Inventors: Yoshio Hirakata, Kameyama (JP); Toshihide Tsubata, Tsu (JP); Masahiro Matsuda, Tsu (JP)

(73) Assignee: Sharp Kabushiki Kaisha, Osaka-shi (JP)

( * ) Notice: Subject to any disclaimer, the term of this patent is extended or adjusted under 35 U.S.C. 154(b) by 407 days.

(21) Appl. No.: 12/373,797

(22) PCT Filed: May 9, 2007

(86) PCT No.: PCT/JP2007/059578
§ 371 (c)(1),
(2), (4) Date: Apr. 6, 2009

(87) PCT Pub. No.: WO2008/010342
PCT Pub. Date: Jan. 24, 2008

(65) Prior Publication Data
US 2010/0000765 A1  Jan. 7, 2010

(30) Foreign Application Priority Data
Jul. 15, 2006  (JP) .................................. 2006-194984

(51) Int. Cl.
*G02F 1/1333* (2006.01)
*G02F 1/1345* (2006.01)

(52) U.S. Cl. ......................... 349/158; 349/152; 349/149

(58) Field of Classification Search .................. 349/158, 349/152, 149
See application file for complete search history.

(56) References Cited

U.S. PATENT DOCUMENTS

| 6,052,172 A * | 4/2000 | Kajiwara et al. ............... 349/152 |
| 7,847,577 B2 * | 12/2010 | Yoshida et al. ........... 324/760.02 |
| 2004/0017531 A1 * | 1/2004 | Nagata et al. .................. 349/139 |

FOREIGN PATENT DOCUMENTS

| JP | 5-303110 A | 11/1993 |
| JP | 05303110 A | * 11/1993 |
| JP | 11-338376 A | 12/1999 |

OTHER PUBLICATIONS

Extended European Search Report dated Aug. 1, 2011, issued in corresponding European application No. 077430130.0.

* cited by examiner

*Primary Examiner* — Mike Qi
(74) *Attorney, Agent, or Firm* — Birch, Stewart, Kolasch & Birch, LLP

(57) ABSTRACT

A substrate for a display panel in which insulation breakdown of an insulating film can be prevented, a display panel having the substrate, a production process of the substrate and a production process of the display panel. The substrate includes an inspection line 123 for transferring a signal for inspection which includes a first section 1231 including a portion overlapping with and/or intersecting an input line 121 drawn from a data signal line in a display region III between which an insulating film 141 is sandwiched and a second section 1232 which includes a portion other than the portion overlapping with and/or intersecting the input line 121 which are formed to be electrically independent from each other and are arranged to be electrically connected by a conductor 128, wherein a difference between areas of the first section 1231 and the input line 121 is reduced.

10 Claims, 13 Drawing Sheets

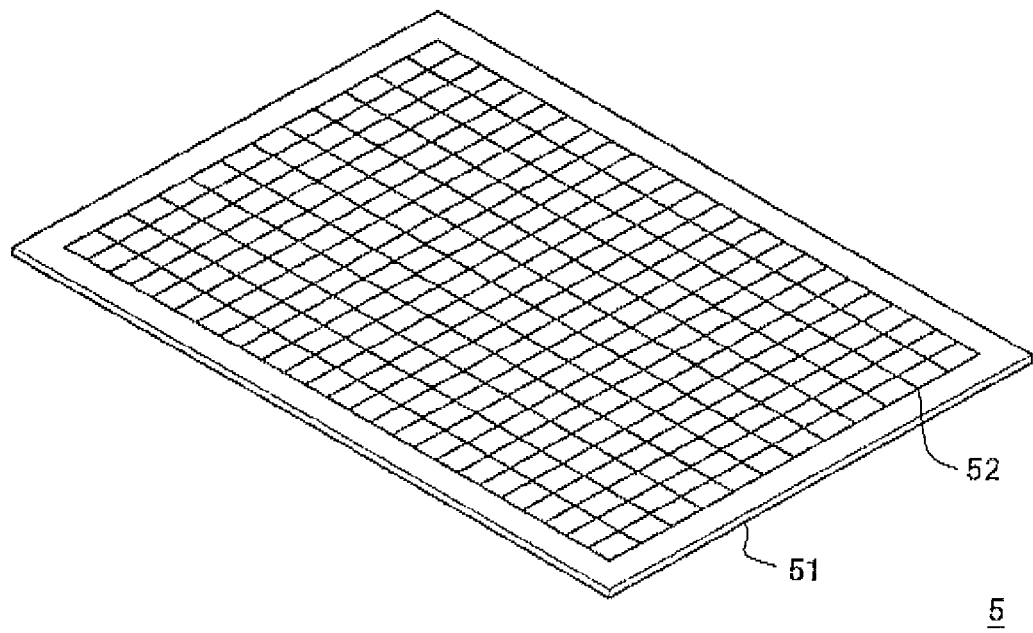
FIG. 6A
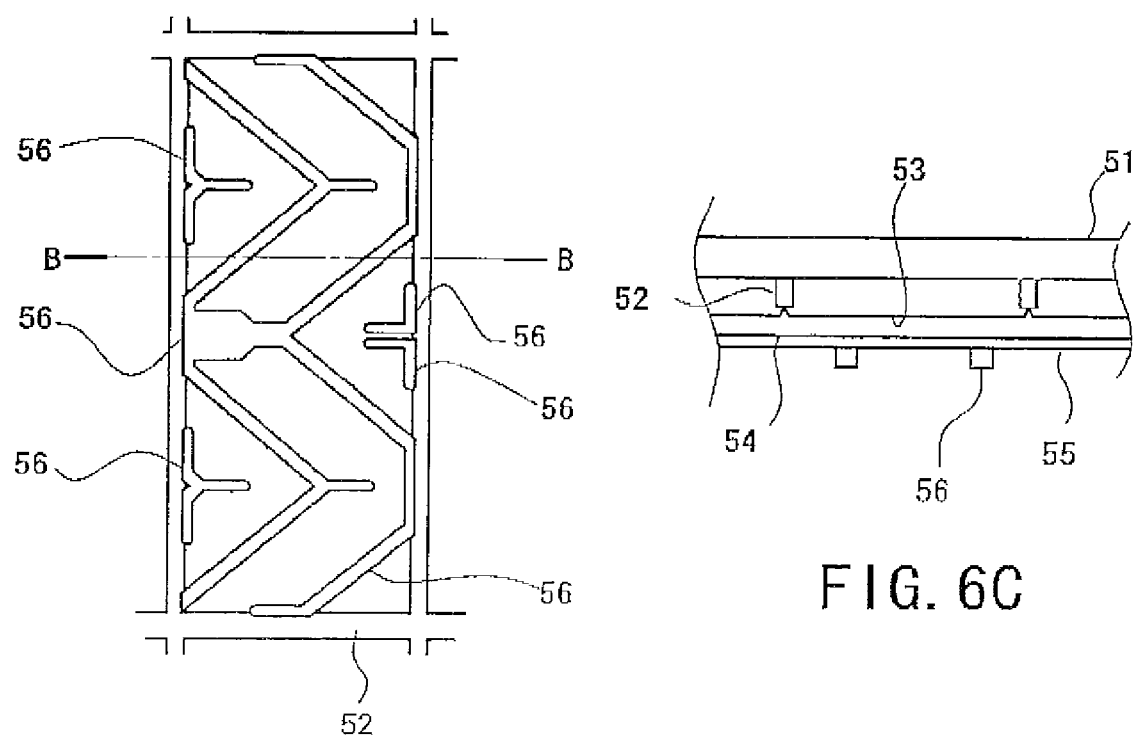
FIG. 6B
FIG. 6C

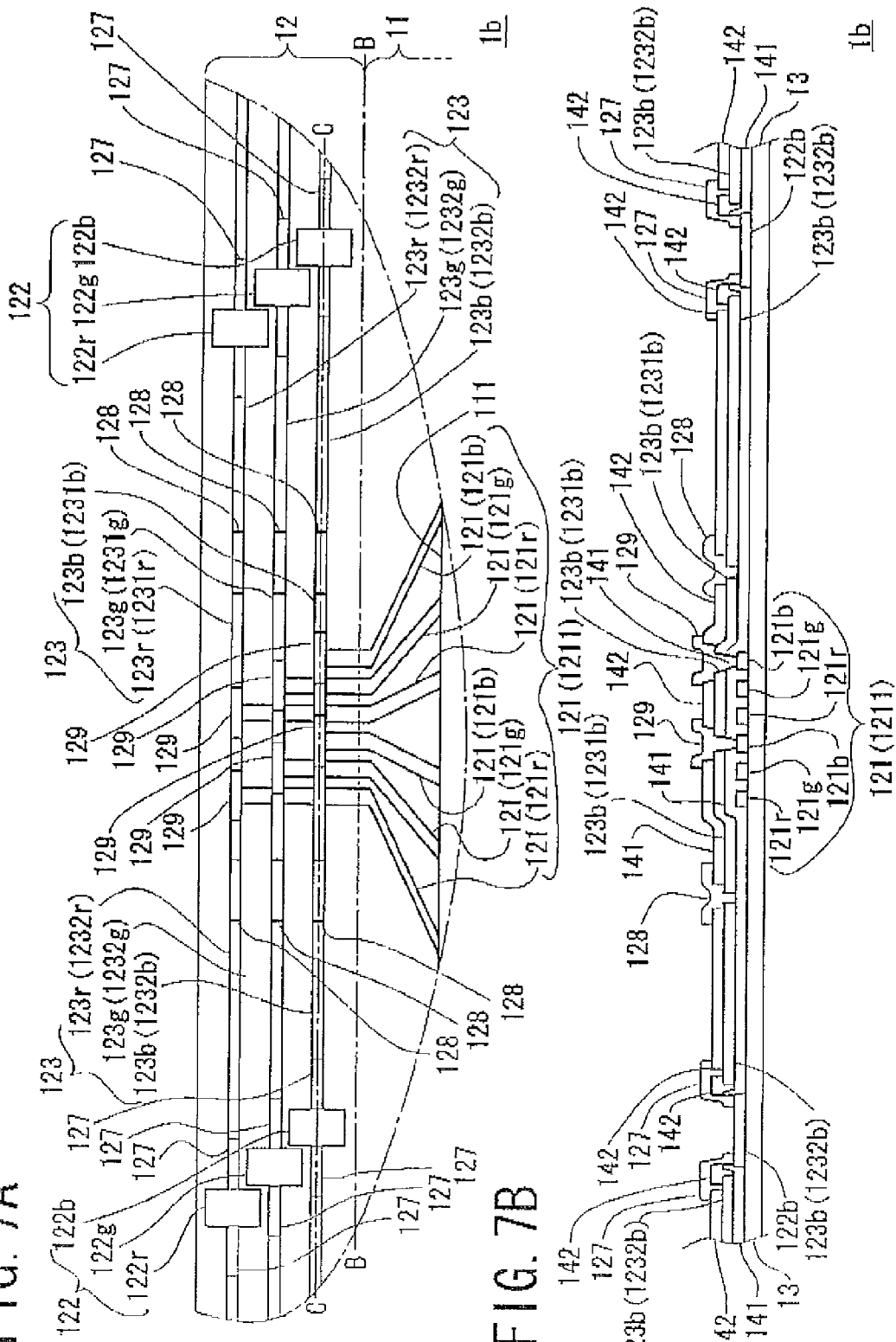

SUBSTRATE FOR A DISPLAY PANEL, A DISPLAY PANEL HAVING THE SUBSTRATE, A PRODUCTION PROCESS OF THE SUBSTRATE, AND A PRODUCTION PROCESS OF THE DISPLAY PANEL

BACKGROUND OF THE INVENTION

1. Field of the Invention

The present invention relates to a substrate for a display panel, a display panel having the substrate, a production process of the substrate and a production process of the display panel, and specifically relates to a substrate for a display panel such as a substrate for a liquid crystal panel having a layered structure which includes conductive films, semiconductive films and insulating films with given patterns, a display panel having the substrate, a production process of the substrate and a production process of the display panel.

2. Description of the Related Art

Some liquid crystal display panels include a TFT array substrate and a color filter which are disposed opposed to each other leaving a tiny space therebetween, and the space is filled with a liquid crystal.

On one surface of the TFT array substrate, thin films including conductive films, semiconductive films and insulating films with given patterns are stacked in a given order. These conductive films, semiconductive films and insulating films form TFTs (Thin Film Transistors) which are used for placing voltages to pixel electrodes. In addition, scanning signal lines (gate signal lines) which transmit scanning signals to gate electrodes of the TFTs, data signal lines (source signal lines) which transmit data signals to source electrodes of the TFTs, and other elements are made from the conductive films, and those elements are insulated from each other by the insulating films.

In addition to these elements, input pads for inspection (input terminals for inspection) with which an inspection probe is to be brought into contact at the time of lighting inspection of the liquid crystal display panel, and inspection line bundles which are to be used for connecting the input pads and the data signal lines or the source signal lines are sometimes provided on the TFT array substrate. The inspection line bundles are various in their structures, and one example thereof is a line bundle which straddles two conductive films between which an insulating film is sandwiched. To be specific, lines which make up the line bundle include sections made from one of the two conductive films between which the insulating film is sandwiched and sections made from the other conductive film. Contact holes are formed at given positions through the insulating film sandwiched therebetween, and the sections are electrically connected by the contact holes.

In the TFT array substrate having the above-described configuration, when the insulating film between the conductive films is broken and the conductive films are electrically connected at a position different from a designed position in a different manner, the TFTs, the data signal lines, the gate signal lines and other elements do not function sometimes as designed, which could cause display defects in the display panel. In addition, when the insulating film is broken in the inspection line bundles, the lighting inspection of the display panel cannot be performed successfully. As a result thereof, the presence of display defects in the display panel and their appearance cannot be detected accurately, and a problem therefore arises in quality control.

Causes of the break in the insulating film include electrical discharge resulting from a potential difference between the conductive films between which the insulating film is sandwiched. For example, in a production process of the substrate for a display panel, static electricity is built up in the conductive films in processes including sputtering and chemical vapor deposition (CVD) for depositing the conductive films and the insulating film, and in a sputtering process for patterning the deposited films. Also in other various processes, static electricity is built up in the conductive films. For example, peeling electrification occurs when the substrate is peeled from supporting tables (supporting stages) of various devices, and static electrification occurs from migration of static electricity which is built up in a human body when a worker touches the conductive films. After static electricity is built up in the conductive films, when the potential difference between the conductive films between which the insulating film is sandwiched goes beyond a withstand voltage of the insulating film, electrical discharge is made between the conductive films, and therefore insulation breakdown of the insulating film occurs.

In order to prevent the insulating film from being broken, the two conductive films between which the insulating film is sandwiched can be arranged to be short-circuited in a production process of a display panel (see Japanese Patent Application Unexamined Publication No. Hei05-303110). In Japanese Patent Application Unexamined Publication No. Hei05-303110, a configuration of a display panel is described in which an insulating film (a gate insulating film in this example) is formed on a transparent substrate on which scanning signal lines and gate electrodes of TFTs are formed such that one end of the formed scanning signal lines is exposed, and a conductive film which forms data signal lines, and source electrodes and drain electrodes of the TFTs is further formed on a surface of the insulating film. Then, in patterning the conductive film, a section which is in direct contact with a thin film pattern such as the scanning signal lines is left as it is. At a final stage of the production process of the TFT array substrate or the production process of the liquid crystal display panel using the TFT array substrate, the section is separated off.

By the configuration as described above, the conductive film which forms the data signal lines and other elements are electrically connected with the scanning signal lines and other elements at a stage of forming the conductive film, and the electrical connection is maintained until the electrically connected section is cut off. Thus, no potential difference arises between the scanning signal lines and other elements and the data signal lines and other elements, whereby insulation breakdown is prevented.

However, in the TFT array substrate having the above-described configuration, it is necessary that portions where source bus lines and gate bus lines are interconnected are placed on the substrate, so that design limitation is imposed on the substrate. In addition, it is necessary that gate metals are exposed in advance before patterning of the source bus lines.

SUMMARY OF THE INVENTION

In order to overcome the problems described above, preferred embodiments of the present invention provide a substrate for a display panel by which insulation breakdown of an insulating film can be prevented, a display panel having the substrate, a production process of the substrate and a production process of the display panel, and a substrate for a display panel by which insulation breakdown of an insulating film which occurs in a production process due to electrical discharge between two conductive films between which an insulating film is sandwiched can be prevented, a display panel having the substrate, a production process of the substrate and a production process of the display panel.

According to a first preferred embodiment of the present invention, a substrate for a display panel including a terminal from which a signal for inspection is inputted, a line drawn from a bus line in a display region, an insulating film, and a line for inspection which includes a section overlapping with and/or intersecting the line drawn from the bus line between which the insulating film is sandwiched and is arranged to electrically connect the terminal from which the inspection signal is inputted with the line drawn from the bus line.

The bus line refers to a line which transfers signals for driving a liquid crystal display panel. The bus line includes a gate bus line (also referred to as a scanning signal line), a source bus line (also referred to as a data signal line) and other lines.

The substrate is arranged such that a relation between an area of the line drawn from the bus line and an area of the inspection line satisfies a formula, $V > |Q_X S_X / C_X - Q_Y S_Y / C_Y|$, where V is a withstand voltage of the insulating film, $Q_X$ is an amount of electrostatic charge per unit area of the line drawn from the bus line, $S_X$ is the area of the line drawn from the bus line, $C_X$ is a capacity of the line drawn from the bus line, $Q_Y$ is an amount of electrostatic charge per unit area of the inspection line, $S_Y$ is the area of the inspection line, and $C_Y$ is a capacity of the inspection line.

According to a second preferred embodiment of the present invention, a substrate for a display panel includes a terminal from which a signal for inspection is inputted, a line drawn from a bus line in a display region, an insulating film, and a line for inspection which includes a portion overlapping with and/or intersecting the line drawn from the bus line between which the insulating film is sandwiched and is arranged to electrically connect the terminal from which the signal for inspection is inputted with the line drawn from the bus line, wherein the inspection line includes more than one section which is formed to be electrically independent from each other, and a conductor which electrically connects the more than one section.

It is preferable that one of the sections of the inspection line includes the portion overlapping with and/or intersecting the line drawn from the bus line between which the insulating film is sandwiched, and the other section includes a portion other than the portion overlapping with and/or intersecting the line drawn from the bus line, wherein the section which includes the portion overlapping with and/or intersecting the line drawn from the bus line between which the insulating film is sandwiched and the section which includes the portion other than the portion overlapping with and/or intersecting the line drawn from the bus line are formed to be electrically independent from each other, and are electrically connected by the conductor.

It is preferable that a relation between an area of the section of the inspection line which includes the portion overlapping with and/or intersecting the line drawn from the bus line between which the insulating film is sandwiched and an area of the line drawn from the bus line satisfies a formula, $V > |Q_X S_X / C_X - Q_Y S_Y / C_Y|$.

In this formula, V is a withstand voltage of the insulating film, $Q_X$ is an amount of electrostatic charge per unit area of the line drawn from the bus line, $S_X$ is the area of the line drawn from the bus line, $C_X$ is a capacity of the line drawn from the bus line, $Q_Y$ is an amount of electrostatic charge per unit area of the section of the inspection line which includes the portion overlapping with and/or intersecting the line drawn from the bus line between which the insulating film is sandwiched, $S_Y$ is the area of the section of the inspection line which includes the portion overlapping with and/or intersecting the line drawn from the bus line between which the insulating film is sandwiched, and $C_Y$ is a capacity of the section of the inspection line which includes the portion overlapping with and/or intersecting the line drawn from the bus line between which the insulating film is sandwiched.

It is preferable that the section of the inspection line which includes the portion other than the portion overlapping with and/or intersecting the line drawn from the bus line is made from the same material and is formed in the same layer as the line drawn from the bus line.

It is preferable that the substrate for a display panel further includes at least a gate bus line and a source bus line as the bus line, wherein the section of the inspection line which includes the portion other than the portion overlapping with and/or intersecting the line drawn from the bus line and the line drawn from the bus line are made from the same material and are formed in the same layer as the source bus line, and the section of the inspection line which includes the portion overlapping with and/or intersecting the line drawn from the bus line between which the insulating film is sandwiched is made from the same material and is formed in the same layer as the source bus line, and further includes a conductor by which the section of the inspection line which includes the portion overlapping with and/or intersecting the line drawn from the bus line between which the insulating film is sandwiched is electrically connected with the line drawn from the bus liner wherein the conductor by which the section of the inspection line which includes the portion overlapping with and/or intersecting the line drawn from the bus line between which the insulating film is sandwiched is electrically connected with the line drawn from the bus line, and the conductor by which the section of the inspection line which includes the portion overlapping with and/or intersecting the line drawn from the bus line between which the insulating film is sandwiched is electrically connected with the section of the inspection line which includes the portion other than the portion overlapping with and/or intersecting the line drawn from the bus line are made from the same material as a pixel electrode.

The substrate for a display panel is used in a display panel.

A process for producing the substrate for a display panel includes at least the steps of forming the line drawn from the bus line in the display region and the section of the inspection line which includes the portion other than the portion overlapping with and/or intersecting the line drawn from the bus line, forming the insulating film which covers the line drawn from the bus line in the display region and the section of the inspection line which includes the portion other than the portion overlapping with and/or intersecting the line drawn from the bus line, forming the section of the inspection line which includes the portion overlapping with and/or intersecting the line drawn from the bus line on a surface of the insulating film, and forming the conductor by which the section of the inspection line which includes the portion overlapping with and/or intersecting the line drawn from the bus line is electrically connected with the line drawn from the bus line and the conductor by which the section of the inspection line which includes the portion overlapping with and/or intersecting the line drawn from the bus line is electrically connected with the section of the inspection line which includes the portion other than the portion overlapping with and/or intersecting the line drawn from the bus line.

It is preferable that the step of the formation of the inspection line, the step of the formation of the line drawn from the bus line, the step of the formation of the insulating film and the step of the formation of the conductors by which predetermined elements among the above-described elements are connected have relations as follows with a step of forming a gate bus line, a step of forming a gate insulating film, a step of forming a source bus line, a step of forming a passivation film and a step of forming a pixel electrode.

That is, concurrently in the step of the formation of the gate bus line, the line drawn from the bus line in the display region and the section of the inspection line which includes the portion other than the portion overlapping with and/or intersecting the line-drawn from the bus line are formed. Concurrently in the step of the formation of the gate insulating film, the first insulating film which covers the line drawn from the bus line in the display region and the section of the inspection line which includes the portion other than the portion overlapping with and/or intersecting the line drawn from the bus line is formed. Concurrently in the step of the formation of the source bus line, the section of the inspection line which includes the portion overlapping with and/or intersecting the line drawn from the bus line is formed. Concurrently in the step of the formation of the passivation film, a second insulating film which covers the section of the inspection line which includes the portion overlapping with and/or intersecting the line drawn from the bus line is formed. Concurrently in the step of the formation of the pixel electrode, the conductor by which the section of the inspection line which includes the portion overlapping with and/or intersecting the line drawn from the bus line is electrically connected with the line drawn from the bus line and the conductor by which the section of the inspection line which includes the portion overlapping with and/or intersecting the line drawn from the bus line is electrically connected with the section of the inspection line which includes the portion other than the portion overlapping with and/or intersecting the line drawn from the bus line are formed.

It is preferable the production process of the substrate for a display panel is included in a production process of a display panel.

According to the preferred embodiments of the present invention, a difference between an area of the line drawn from the bus line in the display region and an area of the portion of the inspection line which overlaps with the line drawn from the bus line between which the insulating film is sandwiched can be reduced. Accordingly, a potential difference can be narrowed between the line drawn from the bus line in the display region and the portion overlapping with the line drawn from the bus line between which the insulating film is sandwiched, and electrical discharge between them is prevented or suppressed, and therefore insulation breakdown of the insulating film provided between them can be prevented or suppressed.

Especially when the relation between the area of the line drawn from the bus line and the area of the inspection line satisfies the above-mentioned formula, electrical discharge between the line drawn from the bus line and the inspection line is prevented more reliably, and therefore insulation breakdown of the insulating film can be prevented.

In addition, according to the preferred embodiments of the present invention, it is not necessary to additionally include steps of forming the inspection line and other elements, which creates no increase in the production cost.

BRIEF DESCRIPTION OF THE DRAWINGS

In FIGS. 4A to 4F, the steps of forming the pixels within the display region are shown, and in FIGS. 4G to 4L, the steps of forming the lines in the inspection line section are shown.

FIGS. 6A, 6B and 6C are views schematically showing a configuration of a color filter which can be used in the display panel. Specifically, FIG. 6A is a perspective view, FIG. 6B is a plan view showing a configuration of one pixel, and FIG. 6C is a cross-sectional view showing the same along the line B-B of FIG. 6B, i.e., a cross sectional structure of the pixel.

FIG. 7A is an enlarged plan view schematically showing apart of an inspection line section of a substrate for a display panel according to a second preferred embodiment of the present invention and, and FIG. 7B is a cross-sectional view showing the same along the line C-C of FIG. 7A.

In FIGS. 11A to 11F, the steps of forming pixels are shown, and in FIGS. 11G to 11L, the steps of forming the lines in the inspection line section are shown.

DETAILED DESCRIPTION OF PREFERRED EMBODIMENTS

A detailed description of a substrate for a display panel according to preferred embodiments of the present invention will now be given with reference to the accompanying drawings.

Figure 1:
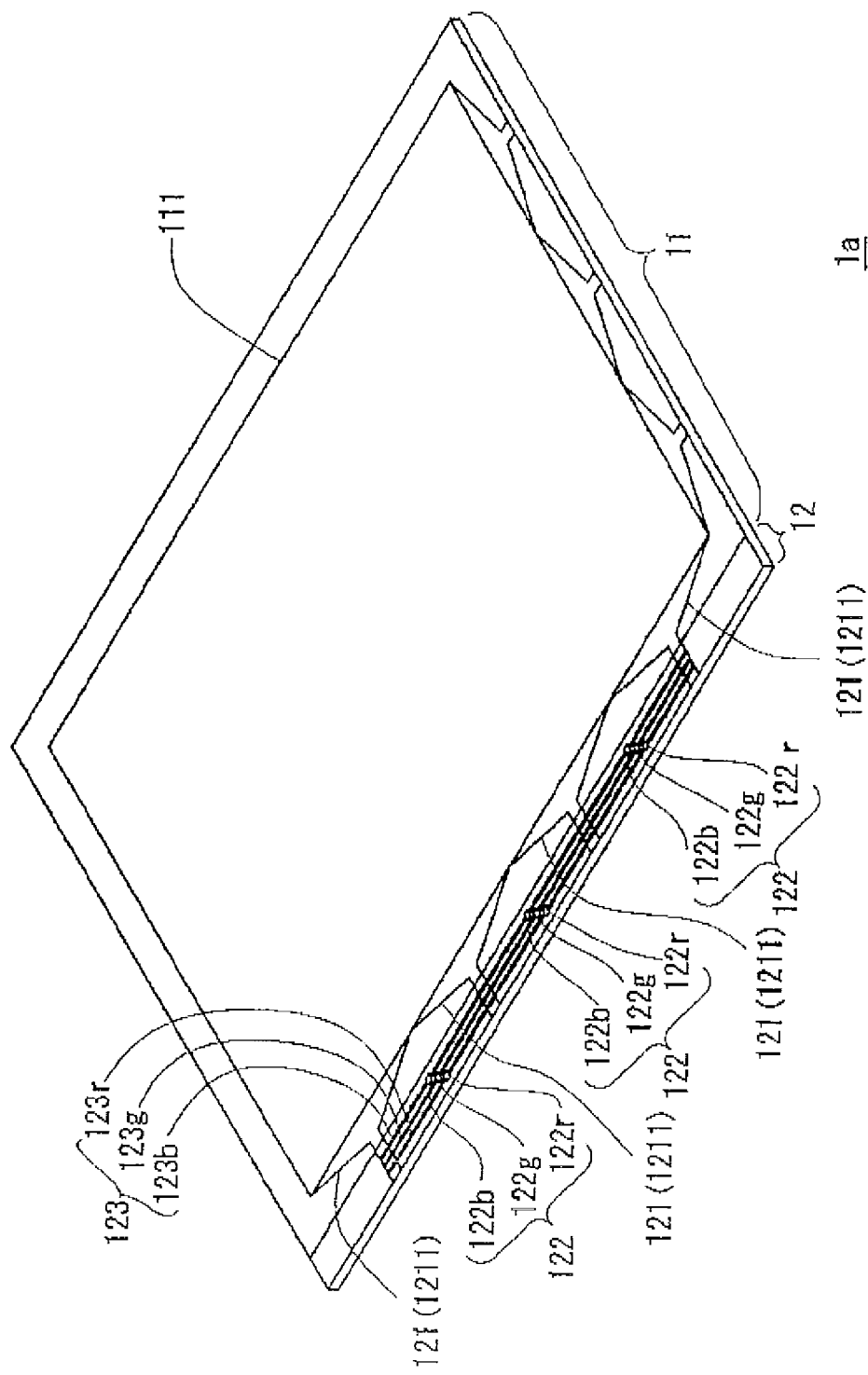
FIG. 1 is a perspective view schematically showing a substrate for a display panel according to a first preferred embodiment of the present invention.

FIG. 1 is an external perspective view schematically showing a configuration of a substrate for a display panel according to a first preferred embodiment of the present invention.

Firstly, an entire configuration of a substrate 1a for a display panel according to the first preferred embodiment of the present invention will be described.

As shown in FIG. 1, the substrate 1a for a display panel according to the first preferred embodiment of the present invention includes a section 11 where a display region 111 is provided (hereinafter, referred to as the "main body section 11"), and a section 12 where lines for lighting inspection of a display panel and other elements are provided (hereinafter, referred to as the "inspection line section 12".

In the display region 111 of the main body section 11, a plurality of pixel electrodes (not shown) and thin film transistors (TFTs) (not shown) of which ON/OFF states are switched to control transfer of data signals to pixels are respectively arranged in a matrix. A plurality of scanning signal lines (also referred to as gate bus lines) to transfer scanning signals to gate electrodes of the TFTs and a plurality of data signal lines (also referred to as source bus lines) to transfer the data signals to source electrodes of the TFTs are provided.

The data signal lines include data signal lines to transfer the data signals to red pixels, data signal lines to transfer the data signals to green pixels, and data signal lines to transfer the data signals to blue pixels, which are arranged substantially in parallel with one another and cyclically. A layer of a first insulating film is provided between a layer where the scanning signal lines are provided and a layer where the data signal lines are provided, and the scanning signal lines and the data signal lines are electrically insulated from each other by the first insulating film.

Lines 121 which are drawn from the data signal lines and lines drawn from the scanning signal lines are provided outside the display region 111 (i.e., on a portion to be a peripheral portion of a panel). The data signals from the outside can be inputted from the lines 121 which are drawn from the data signal lines into the data signal lines. The scanning signals can be inputted from the lines drawn from the scanning signal lines into the scanning signal lines. Hereinafter, the lines 121 are referred to as the "input lines 121". A given number of the input lines 121 make up a line bundle 1211, and a plurality of the line bundles 1211 are provided at given intervals.

The inspection line section 12 is provided with terminals 122 (122r, 122g, 122b) (hereinafter referred to as the "input pads 122 for inspection") from which inspection signals are to be inputted, and a plurality of inspection lines 123 (123r, 123g, 123b).

The input pads 122 for inspection are the terminals from which the inspection signals are to be inputted at the time of lighting inspection of the display panel. For example, the input pads 122 are arranged such that a probe for inspection is brought into contact therewith and the inspection signals are to be inputted therefrom. As shown in FIG. 1, the input pads 122 in one group are adjacent to one another and a plurality of groups of the input pads 122 are respectively provided at given positions. For example, they are provided between the line bundles 1211 of the input lines 121.

The inspection lines 123 (123r, 123g, 123b) electrically connect corresponding input pads 122 with corresponding input lines 121, and electrically connect corresponding input pads 122.

By having such a configuration, when inspection signals are inputted from a given input pad 122, the inputted inspection signals are transferred to the corresponding data signal line via the corresponding inspection line 123 and the corresponding input line 121.

Figures 2A, 2B:
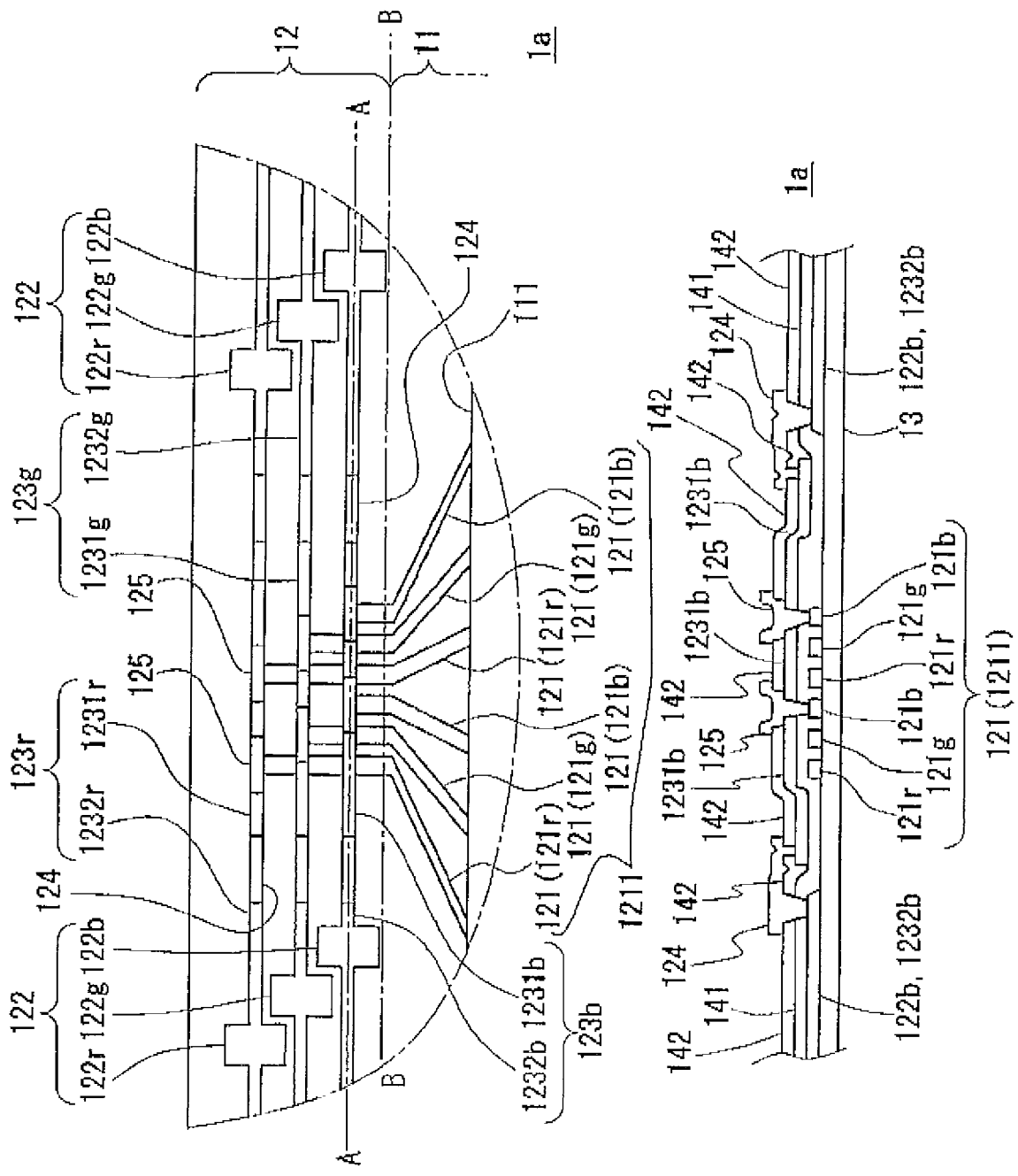
FIG. 2A is an enlarged plan view schematically showing a part of the outside of a display region of the substrate for a display panel according to the first preferred embodiment of the present invention and an inspection line section of the substrate.
FIG. 2B is a cross-sectional view showing the same along the line A-A of FIG. 2A.

FIGS. 2A and 2B are enlarged views schematically showing a part of a peripheral portion of the substrate 1a for a display panel according to the first preferred embodiment of the present invention. To be specific, FIG. 2A is a plan view showing a configuration of the input lines 121 (121r, 121g, 121b) which are provided in the main body section 11 outside the display region 111, and the input pads 122 (122r, 122g, 122b), and FIG. 2B is a cross-sectional view showing the same along the line A-A of FIG. 2A.

As shown in FIG. 2A, one end of the input lines 121 is provided in the vicinity of a peripheral portion of the display region 111, and the other end is provided in the inspection line section 12. A contact section is provided in the vicinity of the peripheral portion of the display region 111 (not shown), and the end of each of the input lines 121 provided in the vicinity of the peripheral portion of the display region 111 is electrically connected with a corresponding data signal line in the contact section.

The given number of the input lines 121 make up each of the line bundles 1211. An entire configuration of each line bundle 1211 gradually shrinks from the peripheral portion of the display region 111 toward the inspection line section 12. In other words, each line bundle 1211 has a taper shape such that the full width of the line bundle 1211 shrinks from the peripheral portion of the display region 111 toward the inspection line section 12. Meanwhile, the input lines 121 are aligned substantially in parallel with and adjacent to one another in the periphery of a border between the main body section 11 and the inspection line section 12 (the border shown in FIG. 2A as a dashed-doted line B).

The number of the input lines 121 making up one line bundle 1211 is not specifically limited, and is established as appropriate in accordance with a horizontal resolution or other factors of the substrate 1a for a display panel (or the display panel). In the present preferred embodiment of the present invention, an example of six input lines 121 making up one line bundle 1211 will be described. To be specific, the one line bundle 1211 includes two input lines 121r from which the data signals are to be inputted to the data signal lines for red pixels, two input lines 121g from which the data signals are to be inputted to the data signal lines for green pixels, and two input lines 121b from which the data signals are to be inputted to the data signal lines for blue pixels.

The input lines 121 are shown in FIG. 2A as formed almost linearly, which is not limited thereto. In actual fact, in order to make resistances of the input lines 121 uniform, the input lines 121 sometimes include partially or entirely curved portions so as to make the lengths of the input lines 121 uniform.

The input pads 122 are made adjacent to one another and the adjacent input pads 122 form one group. The number of the input pads 122 forming one group is established as appropriate in accordance with the structure, a driving method or other factors of the substrate 1a for a display panel (or the display panel). In the present preferred embodiment of the present invention, an example of three input pads 122 making up one group will be described. To be specific, one group includes one input pad 122r from which the inspection signals for red pixels are to be inputted, one input pad 122g from which the inspection signals for green pixels are to be inputted, and one input pad 122b from which the inspection signals for blue pixels are to be inputted.

The inspection lines 123 electrically connect the input pads 122 with the respective input lines 121. To be specific, the inspection line 123r electrically connects the input pads 122r from which the inspection signals for red pixels are to be inputted and the input lines 121r from which the data signals are to be inputted to the data signal lines for red pixels. The inspection line 123g electrically connects the input pads 122g from which the inspection signals for green pixels are to be inputted and the input lines 121g from which the data signals are to be inputted to the data signal lines for green pixels. The inspection line 123b electrically connects the input pads 122b from which the inspection signals for blue pixels are to be inputted and the input lines 121b from which the data signals are to be inputted to the data signal lines for blue pixels.

Each of the inspection lines 123 includes first sections 1231 (1231r, 1231g, 1231b) and second sections 1232 (1232r, 1232g, 1232b) which are formed to be electrically independent from each other. The first sections 1231 define sections each including a portion intersecting or overlapping with at least one of the input lines 121. The second sections 1232 define sections each including a portion other than the portion intersecting or overlapping with the input lines 121. Ends at one side of the first sections 1231 of the inspection lines 123 and ends at one side of the second sections 1232 of the inspection lines 123 are made adjacent to each other, and are electrically connected with each other by corresponding conductors 124.

At positions where the first sections 1231 of the inspection lines 123 each intersect or overlap with at least one of the input lines 121, the first sections 1231 of the inspection lines 123 and the input lines 121 are electrically connected with each other by corresponding conductors 125.

A cross sectional structure of the inspection line section 12 will be described. In FIG. 2B, the cross sectional structure of a portion is shown where the input pad 122b from which the inspection signals for blue pixels are to be inputted and the inspection line 123b are formed. The input pads 122r and 122g and the inspection lines 123r and 123g have the same structures.

As shown in FIG. 2B, in the inspection line section 12, the input pads 122, the second sections 1232 of the inspection lines 123, and the input lines 121 are formed on a surface of a transparent substrate 13, and a first insulating film 141 (a gate insulating film) is formed to cover them. Further, the first sections 1231 of the inspection lines 123 are formed on a surface of the first insulating film 141, and a second insulating film 142 is formed to cover them.

The structure of the electrical connection between the first sections 1231 and the second sections 1232 of the inspection lines 123 will be described. Openings are formed in the second insulating film 142 at positions where it covers the vicinities of ends at both sides of the first sections 1231 of the inspection lines 123. Meanwhile, openings are formed in the first insulating film 141 and the second insulating film 142 at positions where they cover the vicinities of ends at one side of the second sections 1232 of the inspection lines 123. The conductors 124 are provided astride both the openings, which electrically connect the first sections 1231 and the second sections 1232 of the inspection lines 123.

For the structure of the electrical connection between the first sections 1231 of the inspection lines 123 and the input lines 121, the structure of a through hole can be used. To be specific, openings are formed in the first insulating film 141, the first sections 1231 of the inspection lines 123 and the second insulating films 142 at positions where they cover portions where the first sections 1231 of the inspection lines 123 intersect or overlap with the input lines 121. The conductors 125 are provided in the openings, which electrically connect the first sections 1231 of the inspection lines 123 with the corresponding input lines 121.

In FIG. 2B, the first insulating film 141 is formed over the entire surface of the inspection line section 12; however, this is not limited thereto. For example, it is also preferable to form the first insulating film 141 only at the positions where the first sections 1231 of the inspection lines 123 intersect or overlap with the input lines 121. It is essential only that the first sections 1231 of the inspection lines 123 be electrically insulated from the input lines 121 by the first insulating film 141. Therefore, it is not necessary to form the first insulating film 141 over the entire surface.

By the above-described configuration, the inspection signals for red pixels which are inputted from the input pad 122r for red pixels are transferred to the data signal lines for red pixels via the second section 1232r of the inspection line 123r which is drawn from the input pad 122r for red pixels, the conductor 124, the first section 1231r, the through hole, and the input line 121r which is electrically connected with the data signal lines for red pixels. The same applies to the inspection signals for green pixels and the inspection signals for blue pixels.

Thus, a difference between an area of each of the first sections 1231 of the inspection lines 123 and an area of each of the input lines 121 which overlap with the first sections between which the first insulating film 141 is sandwiched can be reduced. Accordingly, during the time after a step of forming the first sections 1231 of the inspection lines 123 and before a step of forming the through holes in the first sections 1231 to go through to the input lines 121, electrical discharge between the first sections 1231 of the inspection lines 123 and the input lines 121 can be prevented or suppressed, and therefore electrostatic breakdown of the first insulating film 141 formed between them can be prevented or suppressed.

A detailed description of a mechanism for preventing or suppressing electrostatic breakdown of the first insulating film 141 is provided. As shown in FIG. 2B, since the first insulating film 141 is formed between the first sections 1231 of the inspection lines 123 and the input lines 121, no electrical connection exists between the first sections 1231 of the inspection lines 123 and the input lines 121 during the time after the step of forming the first sections 1231 of the inspection lines 123 and before the step of forming the through holes in the first sections 1231 to go through to the input lines 121 in a production process of the substrate 1a for a display panel.

If static electricity is built up in the first sections 1231 of the inspection lines 123 or the input lines 121 while no electrical connection exists between the first sections 1231 of the inspection lines 123 and the input lines 121, a potential difference arises between them. When the potential difference goes beyond a withstand voltage of the first insulating film 141, electricity is discharged between the first sections 1231 of the inspection lines 123 and the input lines 121. Then, insulation breakdown occurs in the first insulating film 141 at a position where the electrical discharge occurs.

When insulation breakdown occurs in the first insulating film 141, the first sections 1231 of the inspection lines 123 become electrically continuous with the input lines 121 at the position where the insulation breakdown occurs. Because of this, the first sections 1231 of the inspection lines 123 could become electrically continuous with the input lines 121 where an insulating state should be maintained, resulting in that corresponding inspection signals inputted from the corresponding input pad 122 cannot be transferred to the corresponding data signal line, which raises the possibility of unsuccessful lighting inspection of the display panel.

According to the configuration of the present preferred embodiment of the present invention, electrical discharge between the first sections 1231 of the inspection lines 123 and the input lines 121 can be prevented during the time after the step of forming the first sections 1231 of the inspection lines 123 and before the step of forming the through holes, which prevents insulation breakdown of the first insulating film 141 and therefore allows successful lighting inspection of the display panel to be performed.

It is preferable that a relation between the area of each of the first sections 1231 of the inspection lines 123 and the area of each of the input lines 121 satisfies the following formula:

$$V > |Q_X S_X / C_X - Q_Y S_Y / C_Y| \quad (1).$$

In this formula, V is a withstand voltage of a first insulating film, $Q_X$ is an amount of electrostatic charge per unit area of an input line, $S_X$ is an area of the input line, $C_X$ is a capacity of the input liner $Q_Y$ is an amount of electrostatic charge per unit area of a first section of an inspection line, $S_Y$ is an area of the first section of the inspection line, and $C_Y$ is a capacity of the first section of the inspection line.

It is preferable that the relation satisfies this formula because a potential difference arising between the first sections 1231 of the inspection lines 123 and the input lines 121 changes according to their areas and their amounts of electrostatic charge. Hence, the relation between the area of each of the first sections 1231 of the inspection lines 123 and the area of each of the input lines 121 is established so as to satisfy the formula (1). Accordingly, even if static electricity is built up in the first sections 1231 of the inspection lines 123 and/or the input lines 121 and a potential difference arises therebetween, the potential difference does not go beyond the withstand voltage of the first insulating film 141 if the relation is established in the above-described manner. Therefore, electrical discharge between the first sections 1231 of the inspection lines 123 and the input lines 121 can be prevented more reliably.

Figure 3A:
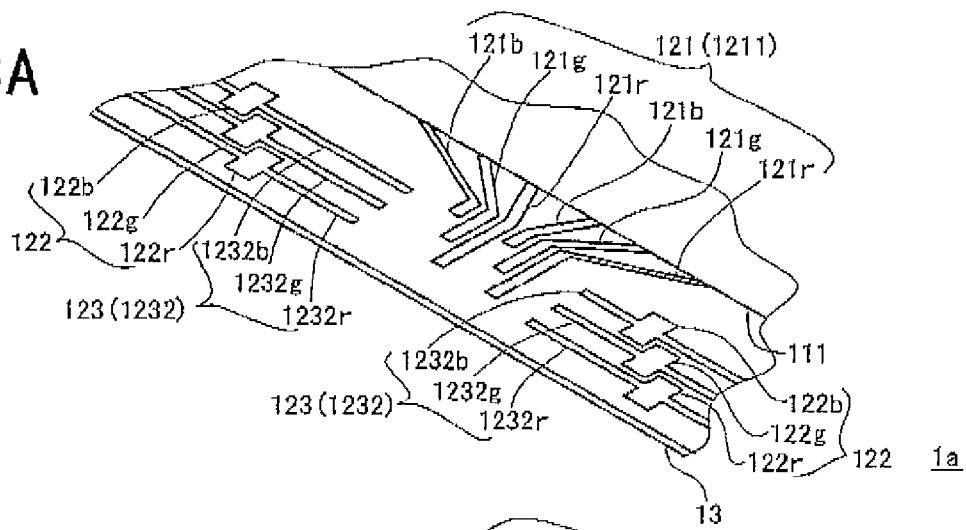
FIGS. 3A, 3B and 3C are perspective views schematically showing the steps of forming lines and elements in the inspection line section and in the vicinity thereof.
Figure 3B:
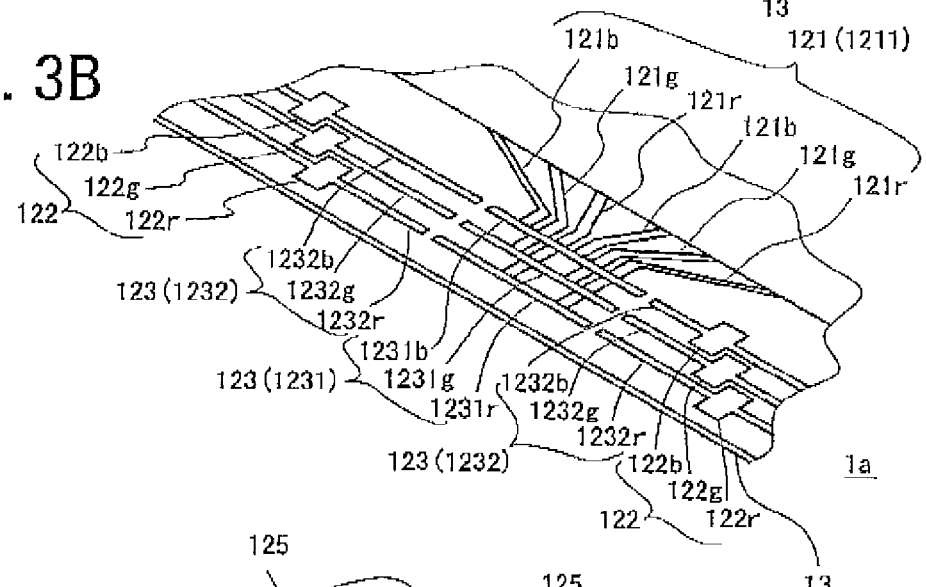
Figure 3C:
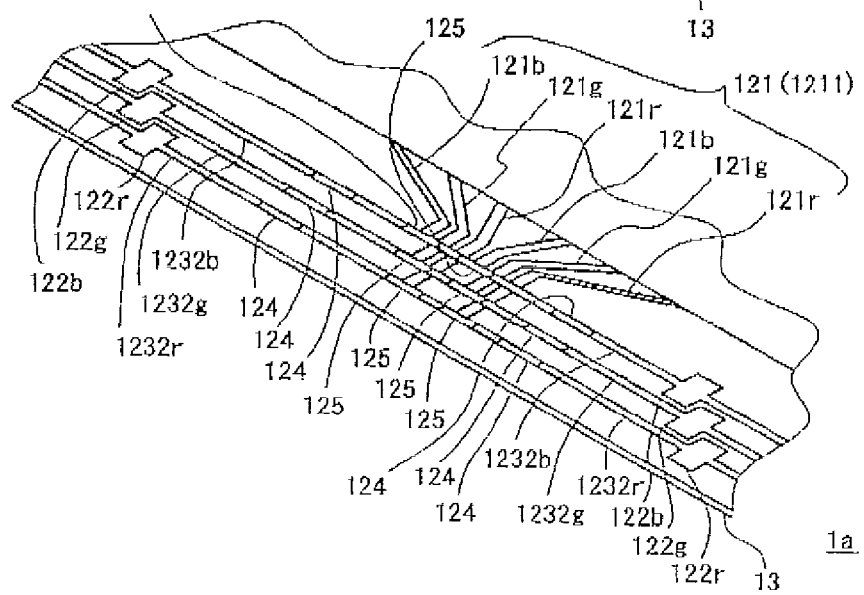

Next, a description of steps of forming lines in the inspection line section 12 and in the main body section 11 outside the display region 111. FIGS. 3A, 3B and 3C are perspective views schematically showing the steps of forming the lines. There is a case where another step of producing the substrate 1a for a display panel is performed during the following steps or simultaneously with them, a description of which is omitted.

As shown in FIG. 3A, the input lines 121, the input pads 122, and the second sections 1232 of the inspection lines 123 are formed on the surface of the transparent substrate 13. For example, a first conductive film is formed on the surface of the transparent substrate 13, on which patterning is performed preferably using a photolithographic method so as to have a pattern of the input lines 121, the input pads 122 and the second sections 1232 of the inspection lines 123.

Next, the first insulating film 141 (not shown) is formed on the surface of the transparent substrate 13 subjected to the above-described step. The formed first insulating film 141 covers the input lines 121, the input pads 122 and the second sections 1232 of the inspection lines 123, so that they are not exposed to the outside.

Then, as shown in FIG. 3B, the first sections 1231 (1231r, 1231g, 1231b) of the inspection lines 123 are formed. For example, a second conductive film is formed on the surface of the transparent substrate 13 subjected to the above-described steps, on which patterning is performed preferably using a photolithographic method so as to have a pattern of the first sections 1231 of the inspection lines 123.

After the substrate 13 undergoes the above-described steps, portions are formed on which the first sections 1231 of the inspection lines 123 intersect or overlap with the input lines 121 between which the first insulating film 141 is sandwiched. However, the input lines 121 are already covered with the first insulating film 141, so that they are electrically insulated (i.e., isolated) from their surroundings. Meanwhile, the first sections 1231 of the inspection lines 123 are left exposed until the second insulating film 142 (not shown) is formed later.

In this state, static electricity could enter from the outside and be built up in the first sections 1231 of the inspection lines 123 while static electricity is hardly built up in the input lines 121. Accordingly, the amounts of electrostatic charge of the input lines 121 differs from those of the first sections 1231 of the inspection lines 123, and a potential difference sometimes arises therebetween.

However, the first sections 1231 of the inspection lines 123 are electrically independent from the other elements (e.g., the second sections 1232, other first sections 1231) as described above, and the difference between the area of each of the first sections 1231 of the inspection lines 123 and the area of each of the input lines 121 is small. Accordingly, the potential difference can be made smaller between the first sections 1231 of the inspection lines 123 and the input lines 121, so that electrical discharge therebetween can be prevented or suppressed, whereby insulation breakdown in the first insulating film 141 can be prevented.

In particular, when the relation between the area of each of the first sections 1231 of the inspection lines 123 and the area of each of the input lines 121 satisfies the formula (1), potential differences between the first sections 1231 of the inspection lines 123 and the input lines 121 do not go beyond the withstand voltage of the first insulating film 141. Therefore, during the time after the step of forming the first sections 1231 of the inspection lines 123 and before the step of forming the through holes, insulation breakdown of the first insulating film 141 due to electrical discharge between the first sections 1231 of the inspection lines 123 and the input lines 121 can be prevented.

After the formation of the first sections 1231 of the inspection lines 123, the second insulating film 142 (not shown) is formed, and the openings are formed in the first insulating film 141 and the second insulating film 142 at the predetermined positions preferably using a photolithographic method. To be specific, the openings are formed in the first insulating film 141 at the positions where it covers the vicinities of the ends at both sides of the first sections 1231 of the inspection lines 123, the openings are formed in the first insulating film 141 and the second insulating film 142 at the positions where they cover the vicinities of the ends at one side of the second sections 1232 of the inspection lines 123, and the openings are formed in the first insulating film 141 and the second insulating film 142 at the positions where they cover portions where the first sections 1231 of the inspection lines 123 intersect or overlap with the corresponding input lines 121.

Then, the conductors 124 which electrically connect the first sections 1231 of the inspection lines 123 and the second sections 1232 of the inspection lines 123, and the conductors 125 which electrically connects the first sections 1231 of the inspection lines 123 with the corresponding input lines 121 are formed.

For example, a third conductive film is formed on the surface of the transparent substrate 13 subjected to the above-described steps, and then the formed third conductive film is removed therefrom while some are left on the openings formed in the vicinities of the ends at both sides of the first sections 1231 of the inspection lines 123 and on the openings formed in the vicinities of the ends at one side of the second sections 1232 of the inspection lines 123, and on the openings formed at the positions where the first sections 1231 of the inspection lines 123 intersect or overlap with the corresponding input lines 121.

Thus, the input pads 122 are electrically connected with the corresponding data signal lines. In addition, by being subjected to the above-described step, the input lines 121 and the first sections 1231 of the inspection lines 123 are electrically integrated, so that no potential difference arises between them after this step, and therefore no insulation breakdown of the first insulating film 141 due to electrical discharge occurs.

Next, a broad description of a production process of the substrate 1a for a display panel will be provided. FIGS. 4A to 4L are cross-sectional views schematically showing the steps of the production process of the substrate 1a for a display panel according to the first preferred embodiment of the present invention. In FIGS. 4A to 4F, the steps of forming the pixels within the display region are shown, and in FIGS. 4G to 4L, the steps of forming the lines in the inspection line section are shown. Besides, FIGS. 4A and 4G, 4B and 4H, 4C and 4I, 4D and 4J, 4E and 4K, and 4F and 4L are views respectively showing the concurrent steps. FIGS. 4A to 4L are schematic views used for explanation, and are not views showing a cross sectional structure along a specific line of the substrate 1a for a display panel according to the first preferred embodiment of the present invention.

The substrate 1a for a display panel according to the first preferred embodiment of the present invention is formed by stacking conductive films, semiconductive films, insulating films and other elements of predetermined shapes in a given order on a surface of the transparent substrate 13 preferably made from a glass.

Figure 4A:
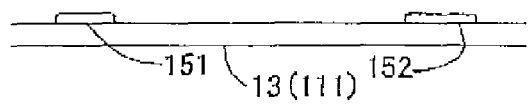
FIGS. 4A to 4L are cross-sectional views schematically showing the steps of a production process of the substrate for a display panel according to the first preferred embodiment of the present invention.

First, as shown in FIG. 4A, scanning signal lines 152, auxiliary capacitance lines (not shown) and gate electrodes 151 of TFTs are formed within the display region 111 of the main body section 11. In this step, the input lines 121 are also formed in the main body section 11 outside the display region 111 so as to stretch to the inspection line section 12, and the input pads 122 and the second sections 1232 of the inspection lines 123 are also formed in the inspection line section 12, as shown in FIG. 4G.

To be specific, a single-layered or multilayered first conductive film preferably made from chromium, tungsten, molybdenum or aluminum is formed on the surface of the transparent substrate 13 preferably using various known sputtering methods. The thickness of the first conductive film is about 100 nm for example, which is not limited specifically.

Patterning is performed on the formed conductive film so as to have patterns of the scanning signal lines 152, the auxiliary capacitance lines (not shown), the gate electrodes 151 of the TFTs, the input lines 121, the input pads 122 and the second sections 1232 of the inspection lines 123. The patterning is performed preferably using wet etching. For example, when the first conductive film is made from chromium, wet etching using a solution of $(NH_4)_2[Ce(NH_3)_6]+HNO_3+H_2O$ is used.

Figure 4B:
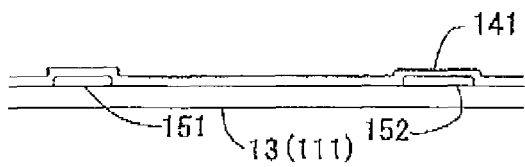
Figure 4C:
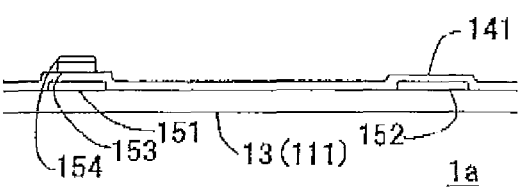
Figure 4D:
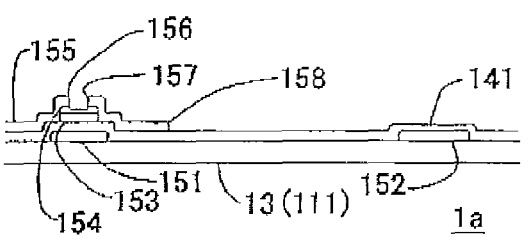
Figure 4E:
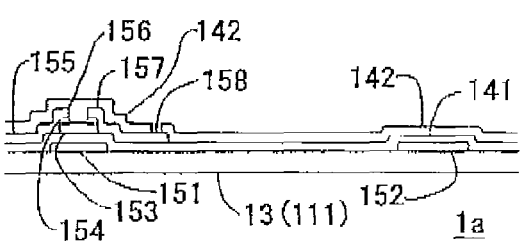
Figure 4F:
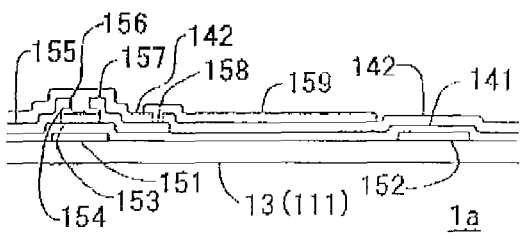
Figure 4G:
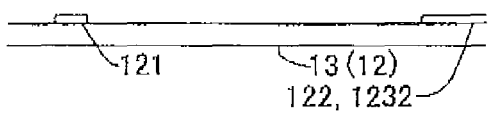

Thus, the patterns of the scanning signal lines 152, the auxiliary capacitance lines (not shown) and the gate electrodes 151 of the TFTs are formed within the display region 111 as shown in FIG. 4A, and the patterns of the input lines 121, the input pads 122 and the second sections 1232 of the inspection lines 123 are formed in the main body section 11 outside the display region 111 and in the inspection line section 12 as shown in FIG. 4G.

Figure 4H:
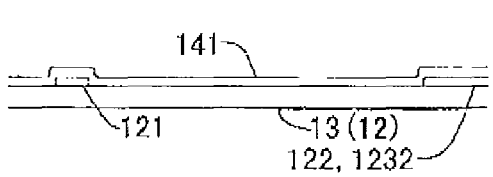
Figure 4I:
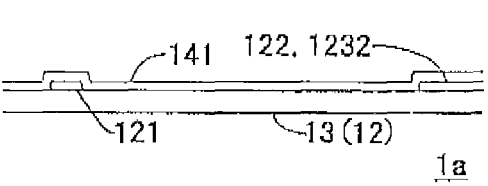

Next, as shown in FIGS. 4B and 4H, the first insulating film (gate insulating film) 141 is formed on the surface of the transparent substrate 13 subjected to the above-described step. The first insulating film 141 is preferably made from SiNx (silicon nitride) of about 300-nanometer thickness, and is formed in a manner of depositing the material using a plasma CVD method. When the first insulating film 141 is formed, the input lines 121 are electrically cut off and isolated from the outside as shown in FIG. 4H.

Next, as shown in FIG. 4C, a semiconductive film 153 and an ohmic contact film 154 are formed in layers at predetermined positions on the surface of the first insulating film 141 (specifically, the positions overlapping with the gate electrodes 151). The semiconductive film 153 is preferably made from amorphous silicon of about 100-nanometer thickness, and the ohmic contact film 154 is preferably made from n$^+$ type amorphous silicon of about 20-nanometer thickness. The ohmic contact film 154 is used for improving ohmic contact with source electrodes 156 and drain electrodes 157 to be formed in a subsequent step.

The semiconductive film 153 and the ohmic contact film 154 are independently formed in a manner of depositing the respective materials using a plasma CVD method. Patterning is performed on the semiconductive film 153 and the ohmic contact film 154 preferably using a photolithographic method so as to have predetermined patterns. In the patterning, wet etching using a solution of $HF+HNO_3$ is used.

Next, as shown in FIG. 4D, data signal lines 155 and drain lines 158, and the source electrodes 156 and the drain electrodes 157 of the TFTs are formed within the display region 111. In this step, the first sections 1231 of the inspection lines 123 are also formed in the inspection line section 12, as shown in FIG. 4J.

To be specific, a single-layered or multilayered second conductive film preferably made from titanium, aluminum, chromium or molybdenum is formed on the surface of the transparent substrate 13 preferably using a plasma CVD method.

Then, patterning is performed on the formed second conductive film. Thus, the data signal lines 155, the source electrodes 156 and the drain electrodes 157 of the TFTs, and drain lines 158 of predetermined shapes which are made of the second conductive film are formed within the display region 111. Meanwhile, the first sections 1231 of a predetermined shape of the inspection lines 123 which are made of the second conductive film are formed in the inspection line section 12. In addition, in the patterning of the second conductive film, the semiconductive film 153 and the ohmic contact film 154 which are formed on the gate electrodes 151 of the TFTs are etched to a given depth.

Figure 4J:
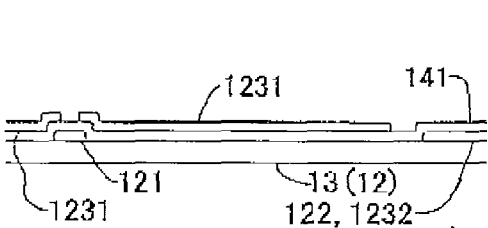

After the substrate 13 undergoes the above-described steps, the TFTs (the gate electrodes 151, the source electrodes 156 and the drain electrodes 157), the scanning signal lines 152, the auxiliary capacitance lines (not shown), the drain lines 158 and the data signal lines 155 are formed within the display region 111 as shown in FIG. 4D, and the input pads 122 and the first sections 1231 and the second sections 1232 of the inspection lines 123 are formed in the inspection line section 12 as shown in FIG. 4J.

Figure 4K:
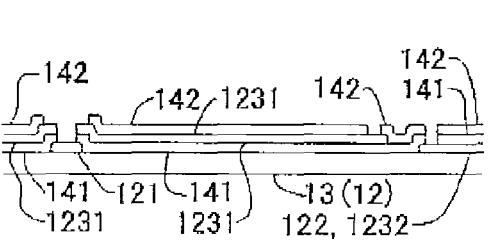

Next, as shown in FIGS. 4E and 4K, the second insulating film (passivation film) 142 is formed on the surface of the transparent substrate 13 subjected to the above-described steps, and patterning is performed on the formed second insulating film 142. Thus, the second insulating film 142 of a predetermined shape is obtained. The second insulating film 142 is preferably made from SiNx (silicon nitride) of about 400-nanometer thickness and is preferably formed using a plasma CVD method, and dry etching preferably using $SF_6+O_2$ can be used as a manner of the patterning.

In the patterning of this step, patterning on the first insulating film 141 formed in the preceding step is also performed concurrently so as to have a predetermined pattern. Thus, in the patterning of this step, pixel contact portions which electrically connect the drain lines 158 and pixel electrodes 159

(see FIG. 4F) are formed within the display region 111 as shown in FIG. 4E while the openings are formed in the second insulating film 142 at the positions where it covers the vicinities of the ends at both sides of the first sections 1231 of the inspection lines 123, the openings are formed in the first insulating film 141 and the second insulating films 142 at the positions where they cover the vicinities of the ends at one side of the second sections 1232 of the inspection lines 123, and openings are formed in the first insulating film 141 and the second insulating film 142 at the positions where they cover the portions where the first sections 1231 of the inspection lines 123 intersect or overlap with the corresponding input lines 121. Then, the first sections 1231 and the second sections 1232 of the inspection lines 123 and the input lines 121 are made exposed.

Figure 4L:
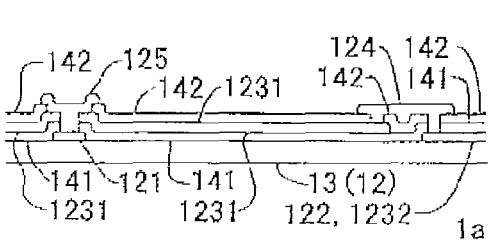

Next, as shown in FIG. 4F, the pixel electrodes 159 are formed within the display region 111. In this step, the conductors 124 and the conductors 125 which electrically connect the corresponding lines respectively are also formed in the inspection line section 12 as shown in FIG. 4L. The pixel electrodes 159 within the display region 111 and the conductors 124 and 125 are made from the same conductor such as ITO (indium tin oxide) of about 150-nanometer thickness.

Specifically, the third conductive film that is the material for the pixel electrodes 159 and the conductors 124 and 125 which electrically connects the corresponding lines is formed on the surface of the transparent substrate 13 subjected to the above-described steps preferably using a plasma CVD method. Patterning is performed on the third conductive film 154 preferably using wet etching using a solution of HCl+HNO$_3$+H$_2$O.

Thus, the pixel electrodes 159 of a predetermined shape are formed within the display region 111 as shown in FIG. 4F. The pixel electrodes 159 are electrically connected with the drain lines 158 at the pixel contact portions formed in the second insulating film 142.

Meanwhile, the conductors 124 which electrically connects the first sections 1231 and the second sections 1232 of the inspection lines 123 are formed astride the openings in the vicinities of the ends at one side of the first sections 1231 and the openings in the vicinities of the ends at one side of the second sections 1232 as shown in FIG. 4L, and the conductors 125 which electrically connect the first sections 1231 and the inspection lines 123 and the corresponding input lines 121 are formed in the openings in the vicinities of the portions of the first sections 1231 where they intersect or overlap with the corresponding input lines 121. Hence, a potential difference large enough to generate electrical discharge does not arise between the first sections 1231 of the inspection lines 123 and the corresponding input lines 121 after this step.

The substrate 1a for a display panel according to the first preferred embodiment of the present invention can be prepared by being subjected to the above-described steps.

The above-described configuration can prevent electrical discharge from arising between the first sections 1231 of the inspection lines 123 and the input lines 121 during the time after the step of forming the first sections 1231 of the inspection lines 123 in the inspection line section 12 and before the step of electrically connecting the first sections 1231 with the input lines 121. Therefore, electrostatic breakdown of the first insulating film 141 can be prevented, allowing lighting inspection of the display panel to be performed successfully.

In addition, in a step of forming the pixels, the bus lines and other elements within the main body section 11, the inspection lines and other elements can be also formed in the inspection line section 12. Hence, it is unnecessary to newly add the step of forming the inspection lines.

Next, a configuration and a production process of a display panel having the substrate 1a for a display panel according to the first preferred embodiment of the present invention will be described.

Figure 5:
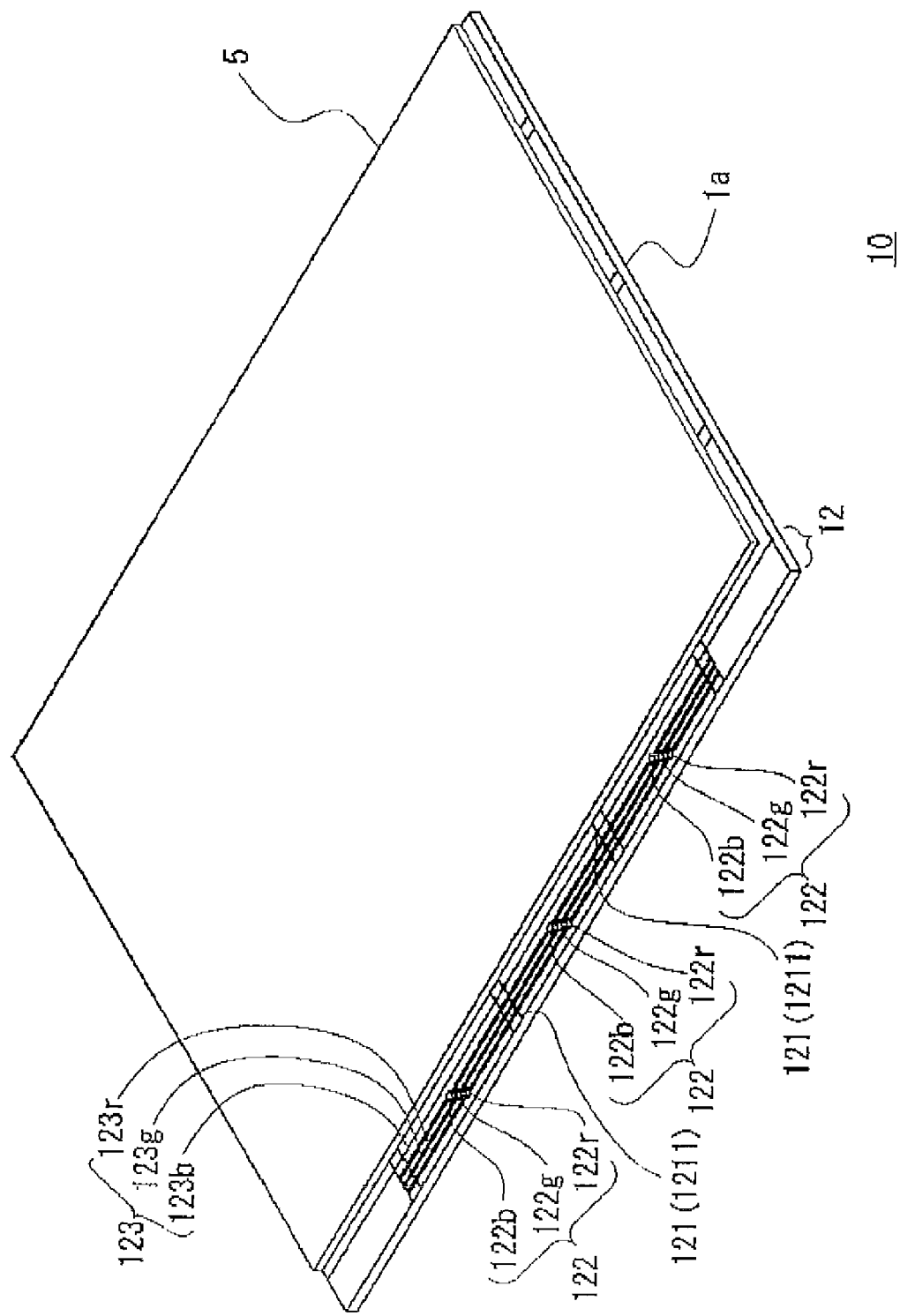
FIG. 5 is a perspective view schematically showing a configuration of a display panel having the substrate for a display panel according to the first preferred embodiment of the present invention.

FIG. 5 is a perspective view schematically showing the configuration of a display panel 10 having the substrate 1a for a display panel according to the first preferred embodiment of the present invention. As shown in FIG. 5, the display panel 10 includes a TFT array substrate that is the substrate 1a for a display panel according to the first preferred embodiment of the present invention, and a color filter 5, and a space between them is tilled with a liquid crystal. The display panel 10 has a configuration of a commonly-used liquid crystal display panel, so that a detailed description thereof is omitted. Besides, the inspection line section is to be separated off after lighting inspection is performed.

The production process of the display panel 10 includes a production process of a TFT array substrate, a production process of a color filter, and a production process of a panel (cell). The production process of the TFT array substrate is as described above.

A configuration and the production process of the color filter 5 are described. FIGS. 6A, 6B and 6C are views schematically showing the configuration of the color filter 5. Specifically, FIG. 6A is a perspective view schematically showing the entire structure of the color filter 5, FIG. 6B is an enlarged plan view showing a configuration of one pixel formed in the color filter 5, and FIG. 6C is a cross-sectional view showing the same along the line B-B of FIG. 6B, i.e., a cross sectional structure of the pixel.

As shown in FIGS. 6A, 6B and 6C, the color filter 5 is formed such that a black matrix 52 is provided on a transparent substrate 51 preferably made from a glass, and color layers 53 preferably made from color resists of a red, green or blue color are formed in each of squares of the black matrix 52, the squares being arranged in a predetermined order. A protective film 54 is formed on surfaces of the black matrix 52 and the color layers 53, and a transparent electrode (common electrode) 55 is formed on a surface of the protective film 54. Alignment control structural elements 56 which are arranged to control alignment of the liquid crystal are formed on a surface of the transparent electrode 55.

The production process of the color filter 5 includes a step of forming a black matrix, a step of forming color layers, a step of forming a protective film and a step of forming a transparent electrode (a common electrode).

The step of forming a black matrix in a resin BM process for example is described. First, a BM photoresist (a photosensitive resin material containing a black coloring material) is coated on the surface of the transparent substrate 51, and then patterning is performed on the coated BM photoresist preferably using a photolithographic method so as to have a predetermined pattern. Thus, the black matrix 52 with the predetermined pattern is obtained. Besides, sometimes in the step of forming a black matrix, a light shielding layer made from the BM photoresist is concurrently formed there. The light shielding layer defining an element to prevent passage of unnecessary light is provided at a given position outside the display region.

In the step of forming color layers, the color layers 53 of red, green and blue colors for color display are formed. The case of using a color resist method is described. First, a color resist (i.e., a solution in which a pigment of a given color is dispersed into a photosensitive material) is coated on the surface of the transparent substrate 51 on which the black matrix 52 is formed, and then patterning is performed on the coated color resist preferably using a photolithographic method so as to have a predetermined pattern. This step is repeated for each of red, green and blue colors. Thus, the color layers 53 of red, green and blue colors are obtained.

The method used in the step of forming a black matrix is not limited to the resin BM process, and various known methods such as a chromium BM method and an overlap method can be preferably used. The method used in the step of forming color layers is not limited to the color resist method, and various known methods such as a printing method, a dyeing process, an electrodeposition method, a transfer method and a photo-etching method can be preferably used. It is also preferable to use a back-face exposure method of forming color layers first and forming a black matrix subsequently.

In the step of forming a protective film, the protective film 54 is formed on the surfaces of the black matrix 52 and the color layers 53 preferably using a method in which a protective film material is coated on the surface of the transparent substrate 51 subjected to the above-described steps with the use of a spin coater (an overcoating method), and a method of forming the protective film 54 with a predetermined pattern preferably in a printing method and a photolithographic method (a patterning method). The protective film material is preferably an acrylate resin or an epoxy resin.

In the step of forming a transparent electrode, the transparent electrode 55 is formed on the surface of the protective film 54 preferably using a masking method. The case of using the masking method is described. A mask is placed on the transparent substrate 51 subjected to the above-described steps and preferably ITO is evaporated onto the mask preferably in a sputtering process, and the transparent electrode 55 is formed.

Then, the alignment control structural elements 56 are formed preferably using a photolithographic method. The surface of the transparent substrate 51 subjected to the above-described steps is coated with a photosensitive material and is exposed through a photomask so as to have a predetermined pattern. Then, unnecessary portions are removed therefrom in a subsequent step of development, and the alignment control structural elements 56 are formed.

The color filter 5 is obtained after being subjected to the above-described steps.

Next, the production process of a panel is described. An alignment layer is formed on a surface of the substrate 1a for a display panel according to the first preferred embodiment of the present invention which is obtained after subjected to the above-described steps (i.e. a TFT array substrate) and an alignment layer is formed on a surface of the color filter 5. The formed alignment layers are subjected to alignment processing. Then, the substrate 1a for a display panel according to the first preferred embodiment of the present invention and the color filter 5 are bonded together and a space therebetween is filled with a liquid crystal.

The alignment layers are formed on the surfaces of the substrate 1a for a display panel according to the first preferred embodiment of the present invention and the color filter 5 in the following manner. First, an alignment material is coated on the surfaces of the substrate 1a for a display panel according to the first preferred embodiment of the present invention and the color filter 5 preferably using an alignment material coating device. An alignment material refers to a solution which contains a substance from which an alignment layer is made. As the alignment material coating device, a commonly-used device such as a cylinder-type press machine and an ink-jet press machine is used. Then, the coated alignment material is heated and baked preferably using a baking system.

Next, the baked alignment layers are subjected to the alignment processing. For the alignment processing, various known processing methods such as a method in which tiny scratches are made on a surface of an alignment layer using a rubbing roll and optical alignment processing in which surface properties of the alignment layer are adjusted by irradiating light energy such as ultraviolet onto the surface of the alignment layer are used.

Next, a sealing material and a common transfer material are coated on either one of the surfaces of the substrate 1a for a display panel according to the first preferred embodiment of the present invention and the color filter 5. A spacer for maintaining a cell gap uniform at a predetermined thickness is sprayed on either one of the surfaces of the substrate 1a for a display panel according to the first preferred embodiment of the present invention and the color filter 5 preferably using a spacer sprayer, and a liquid crystal is dropfilled in a region surrounded by the sealing material on the surface of the substrate 1a for a display panel according to the first preferred embodiment of the present invention or the color filter 5 preferably using a liquid crystal drop fill device. Then, the substrate 1a for a display panel according to the first preferred embodiment of the present invention and the color filter 5 are bonded together in a reduced-pressure atmosphere.

As the sealing material, a commonly-used ultraviolet cure sealing material is used. After the substrate 1a for a display panel according to the first preferred embodiment of the present invention and the color filter 5 are bonded together, the sealing material is irradiated with ultraviolet and cured.

Alternatively, it is preferable that a liquid crystal is sealed-in between the substrate 1a for a display panel according to the first preferred embodiment of the present invention and the color filter 5 after the sealing material is cured.

After subjected to the above-described steps, the liquid crystal display panel is obtained. Then, lighting inspection is performed on the obtained liquid crystal display panel. After the lighting inspection, a region in which the input pads and the inspection line bundle are formed is separated off.

A description of a second preferred embodiment of the present invention is provided. A substrate for a display panel according to the second preferred embodiment of the present invention and the substrate for a display panel of the substrate for the display panel according to the first preferred embodiment of the present invention are different mainly in a configuration of lines for inspection, and are common in the other configurations. Hence, only a description of the different configuration is provided while descriptions of the common configurations are omitted.

FIGS. 7A and 7B are enlarged views schematically showing a part of a peripheral portion of a substrate 1b for a display panel according to the second preferred embodiment of the present invention. To be specific, FIG. 7A is a plan view showing a configuration of an inspection line section 12, and FIG. 7B is a cross-sectional view showing the same along the line C-C of FIG. 7A, i.e., a cross sectional structure of the inspection line section 12.

As shown in FIGS. 7A and 7B, the inspection line section 12 is provided with input lines (121r, 121g, 121b), input pads 122 (122r, 122q, 122b) for inspection and lines 123 (123r, 123g, 123b) for inspection. A given number of the input lines 121 make up a line bundle 1211. The input pads 122 in one group are adjacent to one another.

Each of the inspection lines 123 includes first sections 1231 (1231r, 1231g, 1231b) and second sections 1232 (1232r, 1232g, 1232b). The first sections 1231 define sections each including a portion intersecting or overlapping with at least one of the input lines 121. The second sections 1232 define sections each including a portion other than the portion intersecting or overlapping with the input lines 121.

The first sections 1231 and the second sections 1232 of the inspection lines 123 are formed to be electrically independent from each other. Ends at one side of the second sections 1232 of the inspection lines 123 are made adjacent to the corresponding input pads 122 and ends at the other side thereof are made adjacent to ends at one side of the corresponding first sections 1231 of the inspection lines 123. The second sections 1232 of the inspection lines 123 and the corresponding input pads 122 are electrically connected with each other by corresponding conductors 127, and the second sections 1232 and the first sections 1231 of the inspection lines 123 are electrically connected with each other by corresponding conductors 128.

At the positions where the first sections 1231 of the inspection lines 123 intersect or overlap with the input lines 121, the first sections 1231 of the inspection lines 123 and the corresponding input lines 121 are electrically connected with each other by corresponding conductors 129. The structure of the electrical connection between the first sections 1231 and the second sections 1232 of the inspection lines 123 in the substrate 1a for a display panel according to the first preferred embodiment of the present invention can be used also in the present second preferred embodiment of the present invention.

A cross sectional structure of the inspection line section 12 of the substrate 1b for a display panel according to the second preferred embodiment of the present invention will be described. In FIG. 7B, the cross sectional structure is shown along the input pad 122b for blue pixels and the inspection line 123b which is electrically connected with the input pad 122b. The input pads 122r and 122g and the inspection lines 123r and 123g have the same structures.

As shown in FIG. 7B, the input pads 122 and the input lines 121 are formed on a surface of a transparent substrate 13, and the first insulating film 141 is formed to cover them. Further, the first sections 1231 and the second sections 1232 of the inspection lines 123 are formed on the surface of the first insulating film 141, and the second insulating film 142 is formed to cover them. The first sections 1231 and the second sections 1232 of the inspection lines 123 are formed to be electrically independent from each other as shown in FIG. 7B.

The structure of the electrical connection between the second sections 1232 of the inspection lines 123 and the input pads 122 will be described. Openings are formed in the second insulating film 142 at positions where it covers the vicinities of the ends at one side of the second sections 1232 of the inspection lines 123 (i.e., the ends which are closer to the corresponding input pads 122). In addition, portions of the first insulating film 141 and the second insulating film 142 which overlap with the corresponding input pads 122 are removed to form openings therein, and the corresponding input pads 122 are made exposed. The conductors 127 are provided astride both the openings, which electrically connect the second sections 1232 of the inspection lines 123 and the corresponding input pads 122.

The structure of the electrical connection between the first sections 1231 and the second sections 1232 of the inspection lines 123 will be described. Openings are formed in the second insulating film 142 at positions where it covers the vicinities of ends at both sides of the first sections 1231 of the inspection lines 123. Meanwhile, openings are formed in the second insulating film 142 at positions where it covers the vicinities of ends at the other side of the second sections 1232 of the inspection lines 123 (i.e., the ends which are closer to the first sections 1231 of the inspection lines 123). The conductors 128 are provided astride both the openings, which electrically connect the first sections 1231 and the second sections 1232 of the inspection lines 123.

Figure 8A:
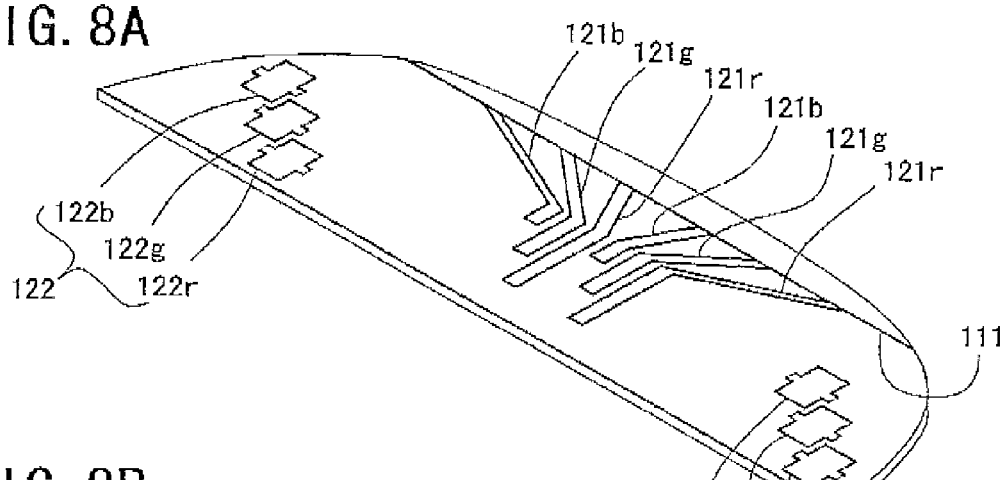
FIGS. 8A, 8B and 8C are perspective views schematically showing the steps of forming lines and elements in the inspection line section and in the vicinity thereof.
Figure 8B:
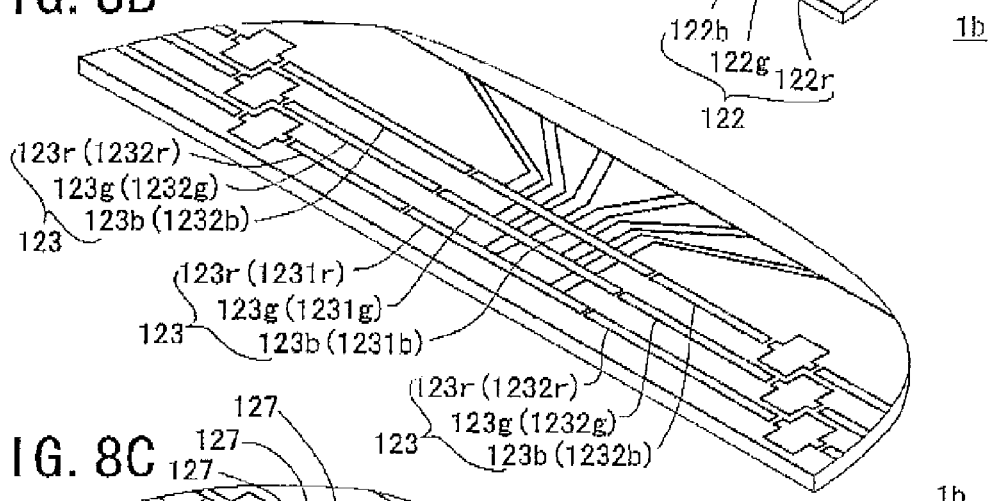
Figure 8C:
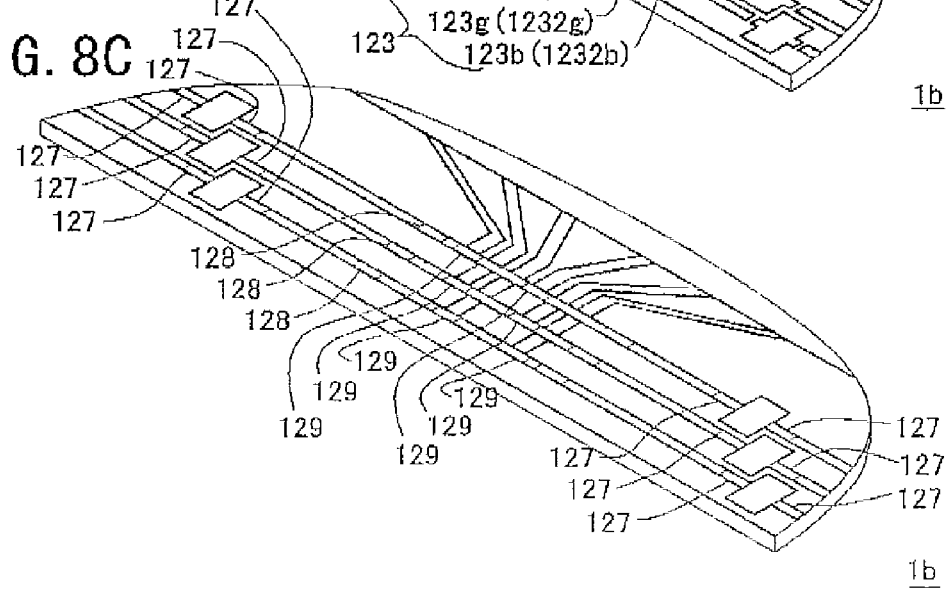

Next, a description of steps of forming lines in the inspection line section 12 and in the main body section 11 outside the display region 111. FIGS. 8A, 8B and 8C are perspective views schematically showing the steps of forming the lines. Descriptions of the steps which are common with the first preferred embodiment of the present invention are omitted. There is a case where another step of producing the substrate 1b for a display panel is performed during the following steps or simultaneously with them, a description of which is omitted.

As shown in FIG. 8A, the input lines 121 (121r, 121g, 121b) and the input pads 122 (122r, 122g, 122b) are formed on the surface of the transparent substrate 13. Then, the first conductive film 141 (not shown) is formed on the surface of the transparent substrate 13 so as to cover them. These elements are formed in the same method as that of forming the input lines 121 according to the first preferred embodiment of the present invention.

Then, as shown in FIG. 5B, the first sections 1231 (1231r, 1231g, 1231b) and the second sections 1232 (1232r, 1232g, 1232b) of the inspection lines 123 (123r, 123g, 123b) are concurrently made from the same material. For example, a second conductive film is formed on the surface of the transparent substrate 13 subjected to the above-described steps, on which patterning is performed preferably using a photolithographic method so as to have a pattern of the first sections 1231 of the inspection lines 123 and a pattern of the second sections 1232 of the inspection lines 123. At the time of finishing being subjected to these steps, the first sections 1231 and the second sections 1232 of the inspection lines 123 are independent and separated from each other, and are not electrically connected.

By the above-described configuration, the area of each of the portions of the first sections 1231 of the inspection lines 123 which overlap with the input lines 121 between which the first insulating film 141 is sandwiched can be reduced. Accordingly, a potential difference can be made smaller between the input lines 121 and the first sections 1231 of the inspection lines 123, so that electrical discharge therebetween can be prevented or suppressed. In particular, if the relation between the area of each of the input lines 121 and the area of each of the first sections 1231 of the inspection lines 123 satisfies the formula (1), the potential difference therebetween can be prevented more reliably from going beyond the withstand voltage of the first insulating film 141.

After the formation of the first sections 1231 and the second sections 1232 of the inspection lines 123, the insulating film 142 (not shown) is formed. Then, the openings are formed at the predetermined positions in the second insulating film 142 formed in this step and in the first insulating film 141 formed in the preceding step.

Then, as shown in FIG. 8C, the conductors 128 which electrically connect the first sections 1231 and the second sections 1232 of the inspection lines 123, the conductors 129 which electrically connect the first sections 1231 of the inspection lines 123 with the corresponding input lines 121, and the conductors 127 which electrically connect the second sections 1232 of the inspection lines 123 with the corresponding input pads 122 are formed. These conductors are formed in the same method as the first preferred embodiment of the present invention.

After the above-described steps, the first sections 1231 of the inspection lines 123 and the input lines 121 are made electrically connected by the conductors 129, whereby the first sections 1231 of the inspection lines 123 and the input lines 121 are electrically integrated, and no insulation breakdown of the first insulating film 141 occurs. Thus, the substrate 1b for a display panel according to the second preferred embodiment of the present invention having the above-described configuration can obtain the same action and effect as the substrate 1a for a display panel according to the first preferred embodiment of the present invention. A configuration and a production process of a display panel having the substrate 1b for a display panel according to the second preferred embodiment of the present invention are almost the same as the first preferred embodiment of the present invention, so that descriptions of them are omitted.

The structure of the electrical connection between the first sections 1231 of the inspection lines 123 and the input pads 122 is not limited to the structures according to the first and second preferred embodiments of the present invention.

It is also preferable that the structure of the electrical connection between the first sections 1231 of the inspection lines 123 and the input pads 122 is a combination of the structures according to the first and second preferred embodiments of the present invention. In other words, the second sections 1232 of the inspection lines 123 may include a plurality of portions which are formed to be electrically independent from each other. Specifically, the second sections 1232 of the inspection lines 123 may include portions which are formed in the layer where the input pads 122 are formed (or, portions which are formed integrally with the input pads 122), and portions which are formed in the layer where the first sections 1231 of the inspection lines 123 are formed, which are electrically connected by the conductors. The substrate 1b for a display panel according to the second preferred embodiment of the present invention can obtain the same action and effect as the substrate 1a for a display panel according to the first preferred embodiment of the present invention.

It is also preferable that the first sections 1231 of the inspection lines 123 and the input pads 122 are formed to be integral while they are formed to be independent from each other in the first and second preferred embodiments of the present invention.

It is essential only that an area of a portion of a line which overlaps with an input line (a line drawn from a bus line) between which an insulating film is sandwiched be reduced.

Next, a description of a third preferred embodiment of the present invention is provided. Descriptions of configurations which are common with the first or second preferred embodiment of the present invention are omitted, and different respects therefrom are explained mainly, providing the same reference numerals to the same configurations or components having the same functions as the first or second preferred embodiment of the present invention.

Figure 9:
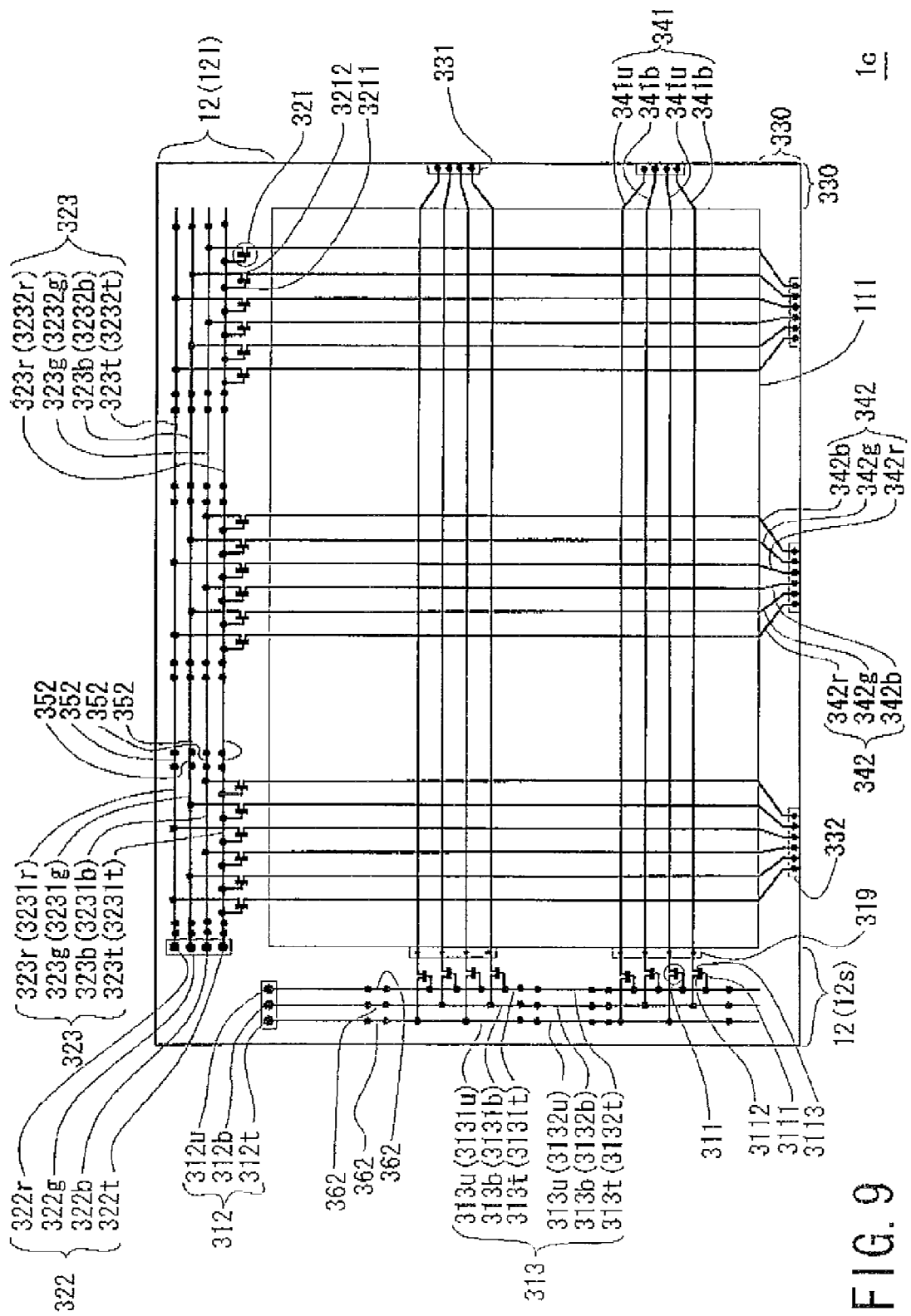
FIG. 9 is a plan view schematically showing a configuration of a substrate for a display panel according to a third preferred embodiment of the present invention.

FIG. 9 is a plan view schematically showing a configuration of a substrate 1c for a display panel according to the third preferred embodiment of the present invention. The substrate 1c for a display panel according to the third preferred embodiment of the present invention shown in FIG. 9 is arranged such that each pixel within a display region 111 includes two subpixels which are driven by their respective switching elements (i.e., TFTs). Sections 12s and 12l where inspection lines and other elements are provided (hereinafter, referred to as the "inspection line sections 12s and 12l") and a region 330 where terminals which connect wiring boards and other elements are provided (hereinafter, referred to as the "terminal section 330") is provided outside the display region 111 (i.e., on the portion to be the peripheral portion of the panel).

As shown in FIG. 9, a plurality of scanning signal lines 341 (341u, 341b) extending substantially in parallel with one another are provided in the display region 111. The scanning signal lines 341u are each arranged to transfer scanning signals to a switching element in one of two subpixels in one pixel, and the scanning signal lines 341b are each arranged to transfer scanning signals to a switching element in the other subpixel. The scanning signal lines 341u and 341b are aligned alternatingly. Auxiliary capacitance lines which are not shown are provided in parallel with the scanning signal lines 341.

Ends at one side of the scanning signal lines 341 (the ends shown at the right in FIG. 9) are drawn into the terminal section 330, and bonding lands 331 are provided in the terminal section 330 so that the wiring boards can be connected therewith. Ends at the other side of the scanning signal lines 341 (the ends shown at the left in FIG. 9) are drawn into the inspection line section 12s and are connected with lines 3113 drawn from drain electrodes of switching elements 313 for inspection to be described later at contact portions 319.

A first insulating film 141 (not shown) is formed on surfaces of the scanning signal lines 341, and a plurality of data signal lines 342 (342r, 342g, 342b) are formed on a surface of the first insulating film 141. The data signal lines 342 extend substantially in parallel with one another in a direction substantially perpendicular to the extending direction of the scanning signal lines 341. The data signal lines 342 include the data signal lines 342r to transfer data signals to red pixels, the data signal lines 342g to transfer data signals to green pixels, and the data signal lines 342b to transfer data signals to blue pixels, which are arranged cyclically.

Ends at one side of the data signal lines 342 (the ends shown in the lower portion in FIG. 9) are drawn into the terminal section 330. Bonding lands 332 are made at the ends of the data signal lines 342 so that the wiring boards can be connected therewith. Ends at the other side of the data signal lines 342 (the ends shown in the upper portion in FIG. 9) are connected with drain electrodes of switching elements 321 for inspection to be described later.

Switching elements (TFTs) by which ON/OFF states of gradation voltages to be applied to pixel electrodes are switched are provided in the vicinities of intersections of the scanning signal lines 341 and the data signal lines 342 in the display region 111 (not shown). Gate electrodes of the switching elements are electrically connected with the respective scanning signal lines 341, source electrodes of the switching elements are electrically connected with the respective data signal lines 342, and drain electrodes of the switching elements are electrically connected with the pixel electrodes via drain lines (also referred to as channel portions).

In the inspection line section 12 provided along a longer side of the substrate 1c for a display panel according to the third preferred embodiment of the present invention (hereinafter, this inspection line section 12 is referred to as the "longer-side inspection line section 12l"), input pads 322 (322r, 322g, 322b, 322t) for inspection, inspection lines 323 (323r, 323g, 323b, 323t), the switching elements (TFTs) 321, lines 3211 drawn from the gate electrodes of the switching elements 321, and lines 3212 drawn from the source electrodes of the switching elements 321 are provided.

The input pads 322 define terminals from which inspection signals are to be inputted at the time of lighting inspection. The inspection signals to be inputted from the input pads 322 include signals to be transferred to the data signal lines 342r for red pixels, signals to be transferred to the data signal lines 342g for green pixels, signals to be transferred to the data signal lines 342b for blue pixels, and signals to be transferred to the gate electrodes of the switching elements 321 so as to switch ON/OFF states thereof.

The inspection lines 323 include the line 323r which transfers the inspection signals to the data signal lines 342r for red pixels, the line 323g which transfers the inspection signals to the data signal lines 342g for green pixels, the line 323b which transfers the inspection signals to the data signal lines 342b for blue pixels, and the line 323t which transfers the inspection signals to the gate electrodes of the switching elements 321. The inspection lines 323 are arranged substantially in parallel with one another.

Each of the inspection lines 323 includes first sections 3231 (3231r, 3231g, 3231b, 3231t) and second sections 3232 (3232r, 3232g, 3232b, 3232t) The first sections 3231 define sections including portions overlapping with or intersecting the lines 3211 drawn from the gate electrodes of the switching elements 321 and/or the lines 3212 drawn from the source electrodes of the switching elements 321. The second sections 3232 define sections other than the first sections 3231.

The first sections 3231 and the second sections 3232 are formed to be electrically independent from each other. For example, the first sections 3231 and the second sections 3232 are arranged alternatingly and are electrically connected with each other by corresponding conductors 352.

In the inspection line section 12 provided along a shorter side of the substrate 1c for a display panel (hereinafter, this inspection line section 12 is referred to as the "shorter-side inspection line section 12s"), input pads 312 (312u, 312b, 312t) for inspection, lines 313 (313u, 313b, 313t) for inspection, switching elements (TFTs) 311 for inspection, lines 3111 drawn from gate electrodes of the switching elements 311, lines 3112 drawn from source electrodes of the switching elements 311, lines 3113 drawn from drain electrodes of the switching elements 311, and the contact portions 319 are provided.

The input pads 312 (312u, 312b, 312t) define electrodes from which inspection signals are to be inputted at the time of lighting inspection. The inspection signals to be inputted from the input pads 312 include signals to be transferred to the scanning signal lines 341 in the display region 111 so as to switch ON/OFF states of the switching elements provided in the display region 111, and signals to switch ON/OFF states of the switching elements 311.

The inspection lines 313 include the line 313u which transfers signals to switch ON/OFF states of switching elements of the subpixels at one side of the pixels, the line 313b which transfers signals to switch ON/OFF states of switching elements of the subpixels at the other side of the pixels, and the line 313t which transfers signals to switch ON/OFF states of the switching elements 311. The inspection lines 313 are arranged substantially in parallel with one another.

Each of the inspection lines 313 includes first sections 3131 (3131u, 3131b, 3131t) and second sections 3132 (3132u, 3132b, 3132t). The first sections 3131 define sections including portions overlapping with or intersecting the lines 3111 drawn from the gate electrodes of the switching elements 311 and/or the lines 3112 drawn from the source electrodes of the switching elements 311. The second sections 3132 define sections other than the first sections 3131.

The first sections 3131 and the second sections 3132 are formed to be electrically independent from each other. The first sections 3131 and the second sections 3132 are arranged alternatingly along the shorter-side inspection line section 12s, and are electrically connected with each other by corresponding conductors 362.

The lines 3111 drawn from the gate electrodes of the switching elements 311 are connected with the line 313t which transfers the signals to the gate electrodes of the switching elements 311. The lines 3112 drawn from the source electrodes of the switching elements 311 are connected with one of the first sections 3131 (3131u, 3131b) of the two lines 313u and 313b which transfer the signals to switch ON/OFF states of the switching elements of the subpixels. The lines 3113 drawn from the drain electrodes of the switching elements 311 are connected at the contact portions 319 with the scanning signal lines 341 in the display region 111.

Figure 10:
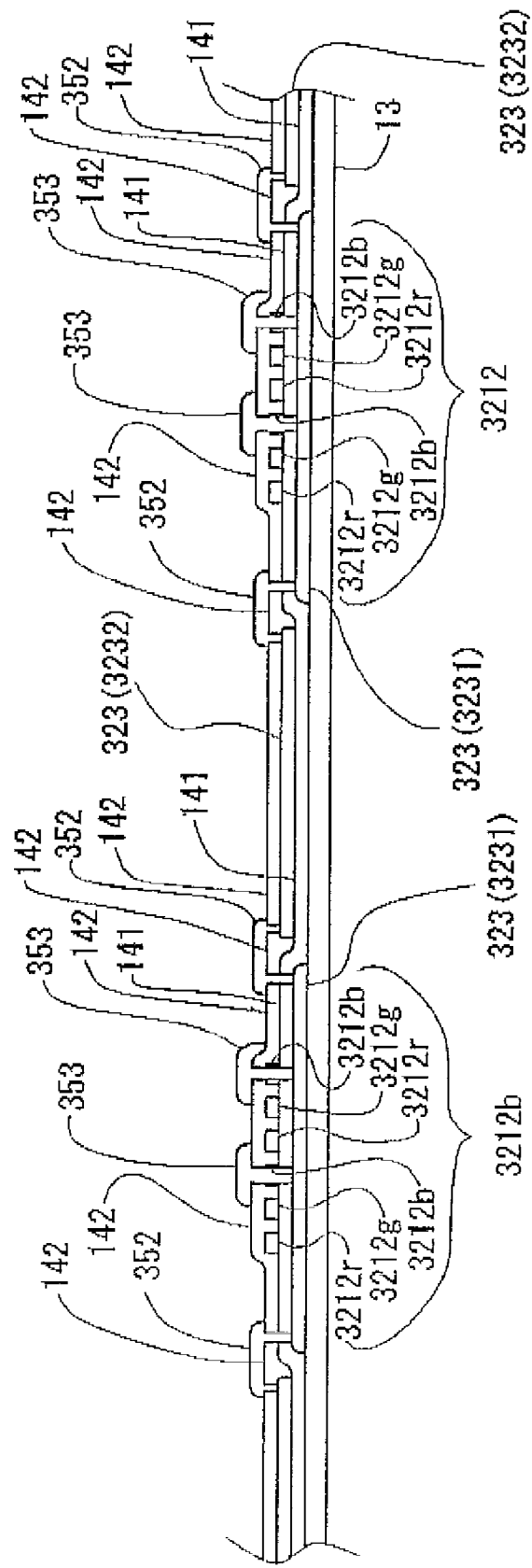
FIG. 10 is a view schematically showing a cross sectional structure of an inspection line section of the substrate for a display panel according to the third preferred embodiment of the present invention.

FIG. 10 is a view schematically showing a cross sectional structure of the longer-side inspection line section 121. As shown in FIG. 10, the first sections 3231 of the inspection lines 323 are formed on the surface of the transparent substrate 13, and the first insulating film 141 is formed to cover them. The second sections 3232 of the inspection lines 323, the lines 3212 drawn from the source electrodes (not shown) of the switching elements 321, and the data signal lines 342 (not shown) connected with the drain electrodes are formed on the surface of the first insulating film 141, and the second insulating film 142 is formed to cover them.

Openings are formed in the first insulating film 141 and the second insulating film 142 at positions where they cover the vicinities of ends at both sides of the first sections 3231 of the inspection lines 323. In addition, openings are formed in the second insulating film 142 at positions where it covers the vicinities of both ends of the second sections 3232 of the inspection lines 323. The conductors 352 are provided astride both the openings.

The conductors 352 electrically connect the first sections 3231 and the second section 3232 of the inspection lines 323. To be specific, the first sections 3231 and the second sections 3232 between which the insulating film 141 is sandwiched are joined alternatingly and are electrically connected with each other by the conductors 352.

The first sections 3231 of the inspection lines 323 overlap with or intersect the lines 3212 drawn from the source electrodes of the switching elements 321 between which the first insulating film 141 is sandwiched. Through holes are provided at positions where the first sections 3231 of the inspection lines 323 overlap with or intersect the corresponding lines 3212 drawn from the source electrodes of the switching elements 321, whereby the first sections 3231 of the inspection lines 323 are electrically connected with the corresponding lines 3212 drawn from the source electrodes of the switching elements 321. The through holes include openings formed in the lines 3212 drawn from the source electrodes of the switching elements 321 and in the first insulating film 141 and conductors 353 formed in the openings.

Besides, the gate electrodes of the switching elements 311 and the lines 3111 drawn therefrom are formed in the same layer as the first sections 3231 of the inspection lines 323 (i.e., between the transparent substrate 13 and the first insulating film 141), which is not shown.

By the above-described configuration, the area of each of the portions of the first sections 3231 of the inspection lines 323 which overlap with the lines 3212 drawn from the source electrodes of the switching elements 321 between which the first insulating film 141 is sandwiched. Accordingly, during the time after forming the lines 3212 drawn from the source electrodes of the switching elements 321 and before electrically connecting the lines 3212 with the first sections 3231 of the inspection lines 323, electrical discharge therebetween can be prevented or suppressed, which prevents insulation breakdown of the first insulating film 141 and therefore allows successful lighting inspection to be performed.

It is preferable that a relation between an area of each of the first sections 3231 of the inspection lines 323 and an area of each of the lines 3212 drawn from the source electrodes of the switching elements 321 satisfies the following formula:

$$V > |Q_X S_X / C_X - Q_Y S_Y / C_Y| \qquad (2).$$

In this formula, V is a withstand voltage of an insulating film, $Q_X$ is an amount of electrostatic charge per unit area of a line drawn from a source electrode of a switching element for inspection, $S_X$ is an area of the line drawn from the source electrode of the switching element, $C_X$ is a capacity of the line drawn from the source electrode of the switching element, $Q_Y$ is an amount of electrostatic charge per unit area of a first section of a line for inspection, $S_Y$ is an area of the first section of the inspection line, and $C_Y$ is a capacity of the first section of the inspection line.

If the relation is established to satisfy the formula (2), potential differences arising between the first sections 3231 of the inspection lines 323 and the lines 3212 drawn from the source electrodes of the switching elements 321 can be made below the withstand voltage of the first insulating film 141. Therefore, electrical discharge therebetween can be prevented more reliably.

Next, a description of steps of forming lines in the inspection line section 12 is provided with reference to FIG. 10. There is a case where another step of producing the substrate 1c for a display panel is performed during the following steps or simultaneously with them, a description of which is omitted. Descriptions of the steps which are common with the first or second preferred embodiment of the present invention are omitted.

Firstly, the first sections 3231 of the inspection lines 323, the input pads 322 (not shown), the gate electrodes of the switching elements 321 (not shown), and the lines 3211 (not shown) drawn from the gate electrodes are formed on the surface of the transparent substrate 13. For example, a first conductive film is formed on the surface of the transparent substrate 13, on which patterning is performed preferably using a photolithographic method so as to have a pattern of the first sections 3231 of the inspection lines 323, the input pads 322, the gate electrodes of the switching elements 321, and the lines 3211 drawn from the gate electrodes.

Next, the first insulating film 141 is formed on the surface of the transparent substrate 13 subjected to the above-described step. The formed first insulating film 141 covers the first sections 3231 of the inspection lines 323, the input pads 322, the gate electrodes of the switching elements 321, and the lines 3211 drawn from the gate electrodes.

Then, the second sections 3232 of the inspection lines 323, the source electrodes (not shown) of the switching elements 321, and the lines 3212 drawn from the source electrodes are formed. For example, a second conductive film is formed on the surface of the transparent substrate 13 subjected to the above-described steps, on which patterning is performed preferably using a photolithographic method so as to have a pattern of the second sections 3232 of the inspection lines 323, the source electrodes of the switching elements 321, and the lines 3212 drawn from the source electrodes.

Then, the second insulating film 142 is formed. The openings are formed in the second insulating film 142 formed in this step and the first insulating film 141 formed in the preceding step at the predetermined positions preferably using a photolithographic method. To be specific, the openings are formed in the second insulating film 142 and the first insulating film 141 at the positions where they cover the vicinities of the ends at both sides of the first sections 3231 and the second sections 3232 of the inspection lines 323, and at positions where the first sections 3231 of the inspection lines 323 overlap with or intersect the lines 3212 drawn from the source electrodes of the switching elements 321.

Next, the conductors 352 which electrically connect the first sections 3231 and the second sections 3232 of the inspection lines 323, the conductors 353 in the through holes (i.e., the conductors which connects the first sections 3231 of the inspection lines 323 and the corresponding lines 3212 drawn from the source electrodes of the switching elements 321) are formed. For example, a conductive film is formed on the surface of the transparent substrate 13 subjected to the above-described steps, and then the formed conductive film is removed therefrom except for the predetermined positions.

A configuration of the shorter-side inspection line section 12s and a formation method thereof are almost the same as those of the longer-side inspection line section 121 except that the "data signal lines 342 connected with the switching elements 321" in the description of the longer-side inspection line section 121 are to be replaced with the "lines 3113 drawn from the drain electrodes of the switching elements 313" and the names and the reference numerals of the elements are to be changed as necessary. Hence, descriptions thereof are omitted.

Thus, the substrate 1c for a display panel according to the third preferred embodiment of the present invention can obtain the same action and effect as the substrate 1a or 1b for a display panel according to the first or second preferred embodiment of the present invention.

FIGS. 11A to 11L are cross-sectional views schematically showing the steps of a production process of the substrate 1c for a display panel according to the third preferred embodiment of the present invention. In FIGS. 11A to 11F, the steps of forming the pixels within the display region are shown, and in FIGS. 11G to 11L, the steps of forming the lines in the longer-side inspection line section 121 are shown. Besides, FIGS. 11A and 11G, 11B and 11H, 11C and 11I, 11D and 11J, 11E and 11K, and 11F and 11L are views respectively showing the concurrent steps. FIGS. 11A to 11L are schematic views used for explanation, and are not views showing a cross sectional structure along a specific line of the substrate 1c for a display panel according to the third preferred embodiment of the present invention. Since the configuration of the shorter-side inspection line section 12s is the same as that of the longer-side inspection line section 121, drawings of the shorter-side inspection line section 12s are omitted, and a description of the shorter-side inspection line section 12s is provided together with the description of the longer-side inspection line section 121 referring to FIGS. 11G to 11L.

For configurations and the steps of forming the pixels in the display region 111 and the bus lines, the same configurations and steps as the substrate 1a for a display panel according to the first preferred embodiment of the present invention are used. That is, the steps shown in FIGS. 11A to 11F correspond to the steps shown in FIGS. 4A to 4F. Accordingly, a description of the production process in the same respects as the first preferred embodiment is omitted, and different respects are explained mainly, providing the same reference numerals to the same structural components as those in the first preferred embodiment of the present invention.

Figure 11A:
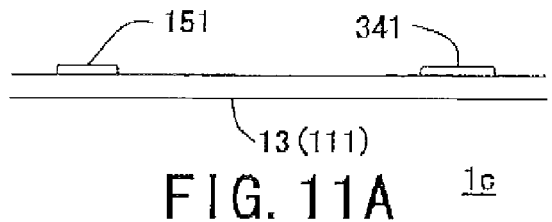
FIGS. 11A to 11L are cross-sectional views schematically showing the steps of a production process of the substrate for a display panel according to the third preferred embodiment of the present invention.

First, the scanning signal lines 341, the auxiliary capacitance lines (not shown) and the gate electrodes 151 of the TFTs are formed within the display region 111 as shown in FIG. 11A. In this step, the first sections 3131 and the second sections 3231 of the inspection lines 313 and 323 and the input pads 312 and 322 (not shown) are also formed in the inspection line sections 12s and 12l as shown in FIG. 11G.

Figure 11B:
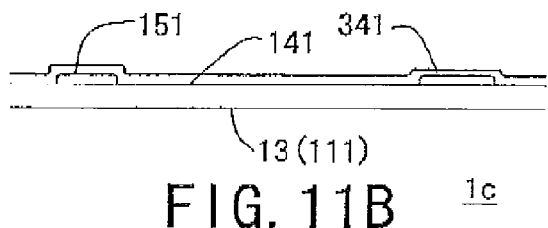
Figure 11C:
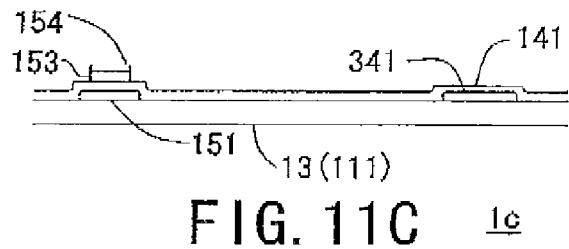
Figure 11D:
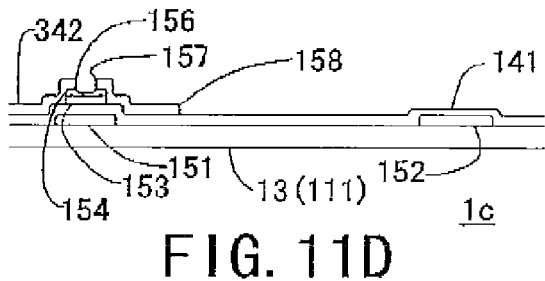
Figure 11E:
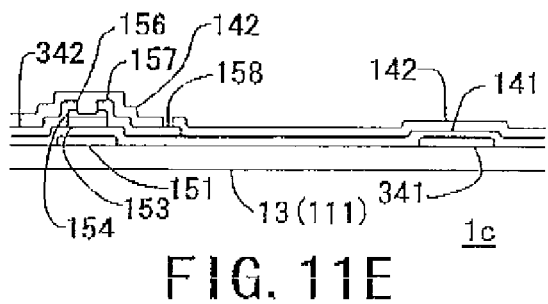
Figure 11F:
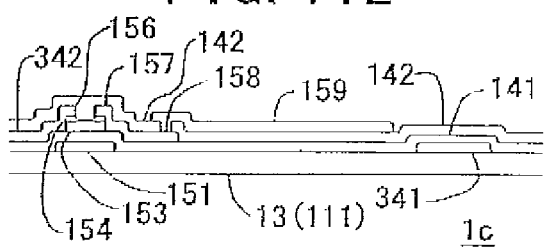
Figure 11G:
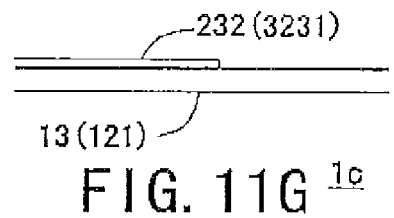
Figure 11H:
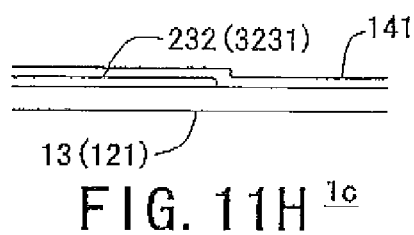
Figure 11I:
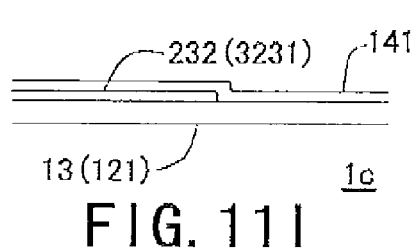

Next, as shown in FIGS. 11B and 11H, the first insulating film 141 is formed on the surface of the transparent substrate 13 subjected to the above-described step, and then as shown in FIG. 11C, the semiconductive films 153 and the ohmic contact films 154 are formed in layers at predetermined positions on the surface of the first insulating film 141, the positions overlapping with the gate electrodes 151.

Figure 11J:
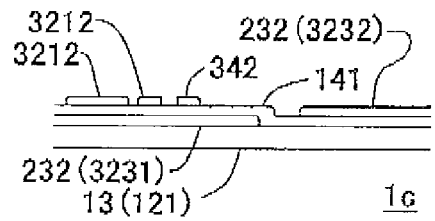

Next, as shown in FIG. 11D, the data signal lines 342 and the drain lines 158, and the source electrodes 156 and the drain electrodes 157 of the TFTs are formed within the display region 111. In this step, the source electrodes and the drain electrodes of the switching elements 311 and 321, and the lines 3112 and 3212 drawn from the source electrodes are also formed in the inspection line sections 12s and 12l as shown in FIG. 11J.

Figure 11K:
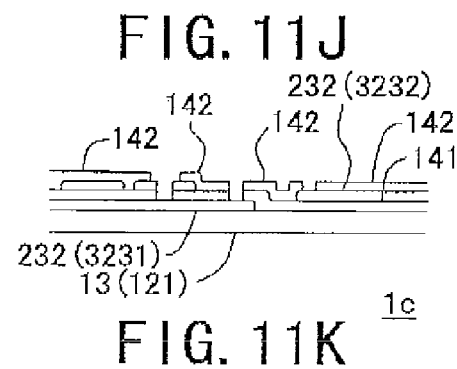

Next, as shown in FIGS. 11E and 11K, the second insulating film 142 is formed and patterning is performed thereon. In the patterning of this step, patterning on the first insulating film 141 formed in the preceding step is also performed concurrently so as to have a predetermined pattern. The patterning of this step forms openings in the second insulating film 142 and the first insulating film 141 at the predetermined positions described above.

Figure 11L:
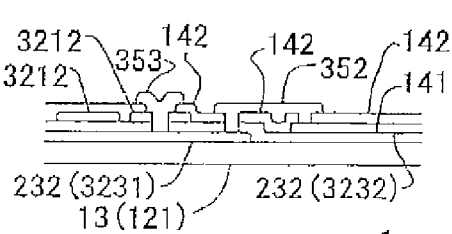

Next, as shown in FIG. 11F, the pixel electrodes 159 are formed within the display region 111. In this step, the conductors 352, 353 and 362 which connect the corresponding lines are also formed in the inspection line sections 12s and 12l as shown in FIG. 11L at the above-described positions. Through this step, the lines 3112 and 3212 drawn from the source electrodes of the switching elements 311 and 321 are electrically connected with the inspection lines 313 and 323. Hence, a potential difference large enough to generate electrical discharge does not arise therebetween after this step.

The substrate 1c for a display panel according to the third preferred embodiment of the present invention can be prepared by being subjected to the above-described steps. The substrate 1c for a display panel according to the third preferred embodiment of the present invention having the above-described configuration can also obtain the same action and effect as the substrate 1a for a display panel according to the first preferred embodiment of the present invention.

Figure 12:
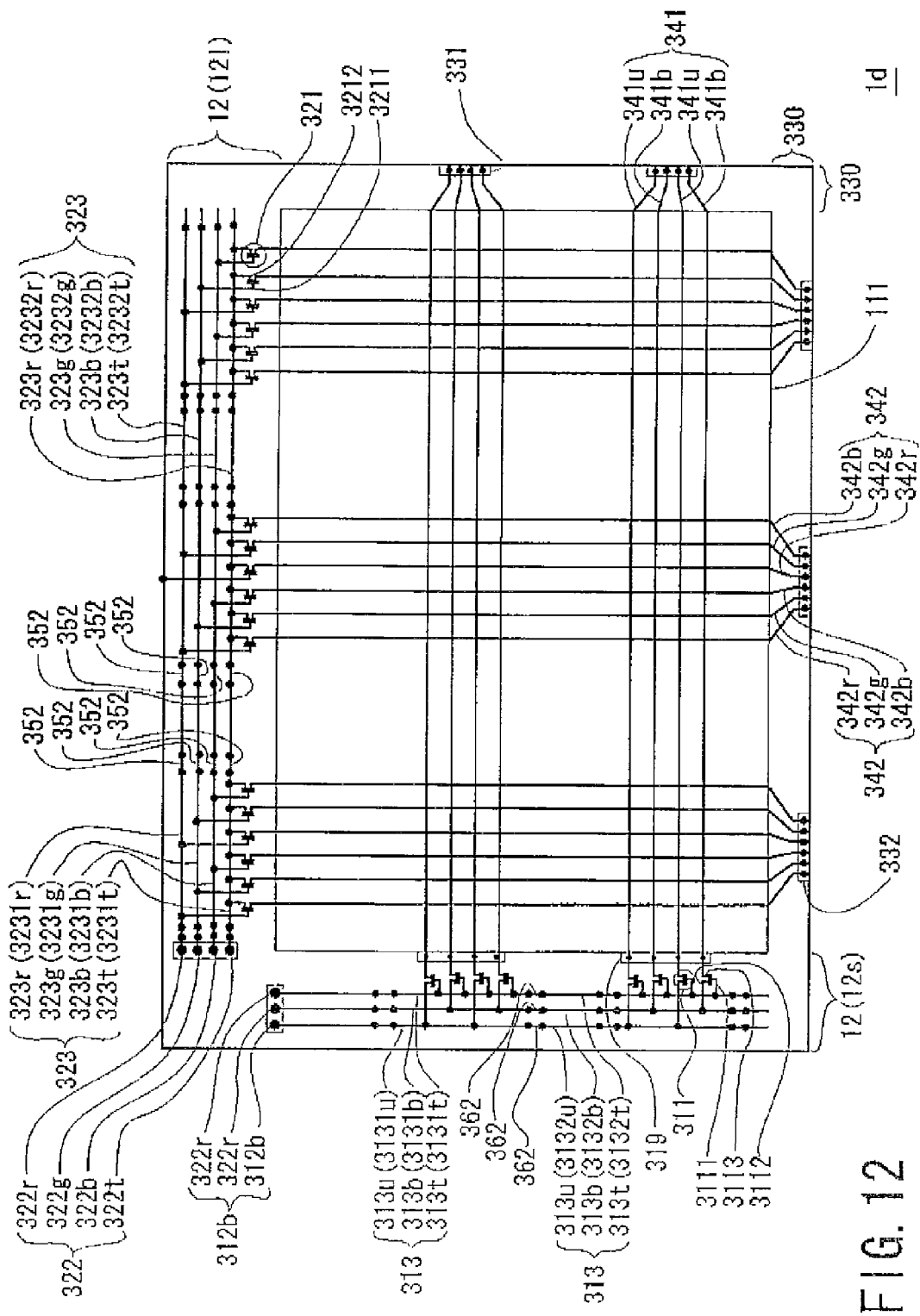
FIG. 12 is a plan view schematically showing a configuration of a substrate for a display panel according to a fourth preferred embodiment of the present invention.

Next, a description of a substrate 1d for a display panel according to a fourth preferred embodiment of the present invention is provided. FIG. 12 is a plan view schematically showing a configuration of the substrate 1d for a display panel according to the fourth preferred embodiment of the present invention. The configuration of the substrate 1d for a display panel according to the fourth preferred embodiment of the present invention is almost the same as that of the substrate 1c for a display panel according to the third preferred embodiment of the present invention except for the configuration of the longer-side inspection line section 121, so that descriptions in the same respects as the third preferred embodiment are omitted, and different respects are explained mainly, providing the same reference numerals to the same structural components as those in the third preferred embodiment of the present invention.

As shown in FIG. 12, input pads 322, lines 323 for inspection, switching elements (TFTs) 321 for inspection, lines 3211 drawn from gate electrodes of the switching elements 321, and lines 3212 drawn from source electrodes of the switching elements 321 are provided in a longer-side inspection line section 121.

The input pads 322 define terminals from which inspection signals are to be inputted at the time of lighting inspection. The input pads 322 include the input pad 322r from which the signals to switch the ON/OFF states of the switching elements 321 connected with data signal lines 342r for red pixels are to be inputted, the input pad 322q from which the signals to switch the ON/OFF states of the switching elements 321 connected with data signal lines 342g for green pixels are to be inputted, the input pad 322b from which the signals to switch the ON/OFF states of the switching elements 321 connected with data signal lines 342b for blue pixels are to be inputted, and the input pad 322t from which the signals to be transferred to the data signal lines 342 (342r, 342g, 342b) for red, green and blue pixels are inputted.

The inspection lines 323 define lines which transfer the inspection signals inputted from the input pads 322 to the switching elements 321, or to the data signal lines 342 via the switching elements 321. The inspection lines 323 include the inspection line 323r which transfers the signals to switch the ON/OFF states of the switching elements 321 connected with the data signal lines 342r for red pixels, the inspection line 323g which transfers the signals to switch the ON/OFF states of the switching elements 321 connected with the data signal lines 342g for green pixels, the inspection line 323b which transfers the signals to switch the ON/OFF states of the switching elements 321 connected with the data signal lines 342b for blue pixels, and the inspection line 323t which transfers inspection signals to the data signal lines 342 (342r, 342g, 342b) for red, green and blue pixels via the switching elements 321. The inspection lines 323 are arranged substantially in parallel with one another.

The first sections 3231 of the inspection lines 323, which are arranged to have a given length, are formed along the edge of the display region 111 and are aligned in series. In other words, the first sections 3231 of each of the inspection lines 323 are aligned to be isolated from one another in the longer-side inspection line section 121. The second sections 3232 are each provided between the first sections 3231 of each of the inspection lines 323 while the first insulating film 141 (not shown) is sandwiched between the second sections 3232 and the first sections 3231. The first sections 3231 and the second sections 3232 of each of the inspection lines 323 are electrically connected with each other by the corresponding conductors 352.

The lines 3212 drawn from the source electrodes of the switching elements 321 are electrically connected with the inspection line 323t which transfers the inspection signals to the data signal lines 342 for red, green and blue pixels. The lines 3211 drawn from the gate electrodes are connected with the corresponding inspection line 323r, 323g or 323b.

Figure 13:
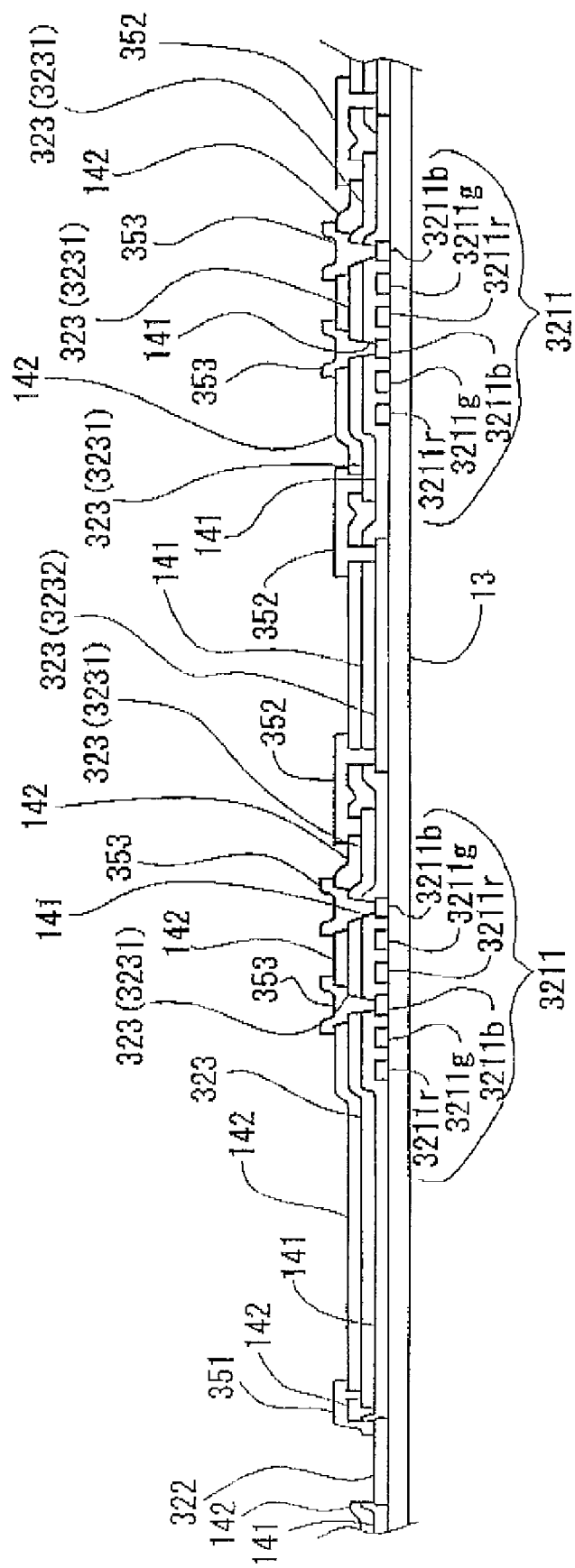
FIG. 13 is a view schematically showing a cross sectional structure of an inspection line section of the substrate for a display panel according to the fourth preferred embodiment of the present invention.

FIG. 13 is a view schematically showing a cross sectional structure of the longer-side inspection line section 121. As shown in FIG. 13, the input pads 322, the second sections 3232 of the inspection lines 323, the gate electrodes of the switching elements 321 (not shown), and the lines 3211 drawn from the gate electrodes are formed in the longer-side inspection line section 121 on the surface of the transparent substrate 13, and the first insulating film 141 is formed to cover them.

The first sections 3231 of the inspection lines 323, the source electrodes (not shown) of the switching elements 321, and the lines 3212 (not shown) drawn from the source electrodes are formed on the surface of the first insulating film 141, and the second insulating film 142 is formed to cover them.

Openings are formed in the first insulating film 141 at positions where it covers the vicinities of ends at both sides of the first sections 3231 of the inspection lines 323. Openings are formed in the first insulating film 141 and the second insulating film 142 at positions where they cover the vicinities of ends at both sides of the second sections 3232 of the inspection lines 323. In addition, openings are formed in the first insulating film 141 and the second insulating film 142 at positions where they overlap with the input pads 322. Conductors 351, the conductors 352 and the conductors 353 are provided astride the respective openings. The conductors 351, 352 and 353 electrically connect the first sections 3231 and the second section 3232 of the inspection lines 323, and whereby the input pads 322 and the second sections 3232 of the inspection lines 323 are electrically connected with each other.

The first sections 3231 of the inspection lines 323 overlap with and/or intersect the lines 3211 drawn from the gate electrodes of the switching elements 321 between which the first insulating film 141 is sandwiched. Through holes are provided at positions where the first sections 3231 of the inspection lines 323 overlap with and/or intersect the corresponding lines 3211 drawn from the gate electrodes of the switching elements 321, whereby the first sections 3231 of the inspection lines 323 are electrically connected with the corresponding lines 3211 drawn from the gate electrodes of the switching elements 321.

Thus, the substrate 1*d* for a display panel according to the fourth preferred embodiment of the present invention having the above-described configuration can obtain the same action and effect as the substrate 1*c* for a display panel according to the third preferred embodiment of the present invention.

For steps of forming lines in the longer-side inspection line section 121 of the substrate 1*d* for a display panel according to the fourth preferred embodiment of the present invention, almost the same steps used in the case of the substrate 1*c* for a display panel according to the third preferred embodiment of the present invention can be used. However, "the second sections in the inspection lines" are formed in the step corresponding to the formation of "the first sections of the inspection lines" according to the third preferred embodiment of the present invention while "the first sections in the inspection lines" are formed in the step corresponding to the formation of "the second sections of the inspection lines" according to the third preferred embodiment of the present invention.

A configuration and a production process of a display panel having the substrate 1*c* for a display panel according to the third preferred embodiment of the present invention or the substrate 1*d* for a display panel according to the fourth preferred embodiment of the present invention are the same as those of the display panel having the substrate 1*a* for a display panel according to the first preferred embodiment of the present invention, so that descriptions thereof are omitted. However, in the display panel having the substrate 1*c* for a display panel according to the third preferred embodiment of the present invention or the substrates 1*d* for a display panel according to the fourth preferred embodiment of the present invention, it is unnecessary to separate off the inspection line section 12 after lighting inspection is performed.

The configuration and a manner of lighting inspection of the display panel having the substrate 1*c* for a display panel according to the third preferred embodiment of the present invention are the same as those described in Japanese Patent Application Unexamined Publication No. Hei 11-338376 corresponding to Japanese Patent Application No. Hei 11-72641 filed by the present applicant.

While the preferred embodiments of the present invention have been described above referring to the drawings, it is to be understood that variations and modifications will be apparent to those skilled in the art without departing the scope and spirit of the present invention.

For example, the number of the input pads is not limited to the numbers of the input pads of the substrates for a display panel according to the above-described preferred embodiments of the present invention. Described in the above-described preferred embodiments of the present invention is a configuration such that one group of the input pads include the input pad from which the inspection signals for red pixels are inputted, the input pad from which the inspection signals for green pixels are inputted and the input pad from which the inspection signals for blue pixels are inputted; however, other configurations can be also applied to the present invention. If a display panel which is arranged to be driven by inputting data signals opposite in polarity into adjacent pixels (e.g., in a line reverse drive method, in a dot reverse drive method) is used, a configuration such that six input pads for inspection and lines are provided so that data signals opposite in polarity can be inputted therefrom can be used.

The number of the lines included in the line bundles drawn from the display region is not limited to the specific number. The number of the lines included in one line bundle can be established as appropriate in accordance with a resolution of the display panel (i.e., the number of the data signal lines) and driver ICs mounted on the display panel.

Thus, the numbers of the input pads and the lines are established as appropriate as described above and not limited to the above-described numbers. That is, it is essential only that a configuration such that electrical discharge can be prevented by reducing an area of a portion of a liner the portion overlapping with another line between which an insulating film is sandwiched.

The configurations and the production processes of the TFT array substrates and the color filters described above are given only as examples, and the configuration and the production process are not limited thereto.

What is claimed is:

1. A substrate for a display panel comprising:
a terminal from which a signal for inspection is inputted;
a line drawn from a bus line in a display region;
an insulating film; and
a line for inspection which includes a section overlapping with and/or intersecting the line drawn from the bus line between which the insulating film is sandwiched, and is arranged to electrically connect the terminal from which the signal for inspection is inputted with the line drawn from the bus line,
wherein a relation between an area of the line drawn from the bus line and an area of the inspection line satisfies a formula, $V > |Q_X S_X / C_X - Q_Y S_Y / C_Y|$, where
V is a withstand voltage of the insulating film;
$Q_X$ is an amount of electrostatic charge per unit area of the line drawn from the bus line;
$S_X$ is the area of the line drawn from the bus line;
$C_X$ is a capacity of the line drawn from the bus line;
$Q_Y$ is an amount of electrostatic charge per unit area of the inspection line;
$S_Y$ is the area of the inspection line; and
$C_Y$ is a capacity of the inspection line.

2. A display panel comprising the substrate for a display panel according to claim 1.

3. A substrate for a display panel comprising:
a terminal from which a signal for inspection is inputted;
a line drawn from a bus line in a display region;
an insulating film; and
a line for inspection which includes a portion overlapping with and/or intersecting the line drawn from the bus line between which the insulating film is sandwiched, and is arranged to electrically connect the terminal from which the signal for inspection is inputted with the line drawn from the bus line,
wherein the inspection line comprises:
more than one section which is formed to be independent from each other; and
a conductor which electrically connects the more than one section.

4. The substrate for a display panel according to claim 3, wherein one of the sections of the inspection line includes the portion overlapping with and/or intersecting the line drawn from the bus line between which the insulating film is sandwiched, and the other section includes a portion other than the portion overlapping with and/or intersecting the line drawn from the bus line, and
wherein the section which includes the portion overlapping with and/or intersecting the line drawn from the bus line between which the insulating film is sandwiched and the section which includes the portion other than the portion overlapping with and/or intersecting the line drawn from the bus line are formed to be electrically independent from each other, and are electrically connected by the conductor.

5. The substrate for a display panel according to claim 3, wherein a relation between an area of the section of the inspection line which includes the portion overlapping with and/or intersecting the line drawn from the bus line between which the insulating film is sandwiched and an area of the line drawn from the bus line satisfies a formula, $V > |Q_X S_X/C_X - Q_Y S_Y/C_Y|$, where
$V$ is a withstand voltage of the insulating film;
$Q_X$ is an amount of electrostatic charge per unit area of the line drawn from the bus line;
$S_X$ is the area of the line drawn from the bus line;
$C_X$ is a capacity of the line drawn from the bus line;
$Q_Y$ is an amount of electrostatic charge per unit area of the section of the inspection line which includes the portion overlapping with and/or intersecting the line drawn from the bus line between which the insulating film is sandwiched;
$S_Y$ is the area of the section of the inspection line which includes the portion overlapping with and/or intersecting the line drawn from the bus line between which the insulating film is sandwiched; and
$C_Y$ is a capacity of the section of the inspection line which includes the portion overlapping with and/or intersecting the line drawn from the bus line between which the insulating film is sandwiched.

6. The substrate for a display panel according to claim 3, wherein the section of the inspection line which includes the portion other than the portion overlapping with and/or intersecting the line drawn from the bus line is made from a same material and is formed in a same layer as the line drawn from the bus line.

7. The substrate for a display panel according to claim 3, further comprising at least a gate bus line and a source bus line as the bus line,
wherein the section of the inspection line which includes the portion other than the portion overlapping with and/or intersecting the line drawn from the bus line, and the line drawn from the bus line are made from the same material and are formed in the same layer as the source bus line, and
the section of the inspection line which includes the portion overlapping with and/or intersecting the line drawn from the bus line between which the insulating film is sandwiched is made from a same material and is formed in a same layer as the source bus line, and further comprising a conductor by which the section of the inspection line which includes the portion overlapping with and/or intersecting the line drawn from the bus line between which the insulating film is sandwiched is electrically connected with the line drawn from the bus line,
wherein the conductor by which the section of the inspection line which includes the portion overlapping with and/or intersecting the line drawn from the bus line between which the insulating film is sandwiched is electrically connected with the line drawn from the bus line, and the conductor by which the section of the inspection line which includes the portion overlapping with and/or intersecting the line drawn from the bus line between which the insulating film is sandwiched is electrically connected with the section of the inspection line which includes the portion other than the portion overlapping with and/or intersecting the line drawn from the bus line are made from a same material as a pixel electrode.

8. A process for producing a substrate for a display panel comprising the steps of:
forming a line drawn from a bus line in a display region, and a section of a line for inspection which includes a portion other than a portion overlapping with and/or intersecting the line drawn from the bus line;
forming an insulating film which covers the line drawn from the bus line in the display region, and the section of the inspection line which includes the portion other than the portion overlapping with and/or intersecting the line drawn from the bus line;
forming a section of the inspection line which includes the portion overlapping with and/or intersecting the line drawn from the bus line on a surface of the insulating film; and
forming a conductor by which the section of the inspection line which includes the portion overlapping with and/or intersecting the line drawn from the bus line is electrically connected with the line drawn from the bus line, and a conductor by which the section of the inspection line which includes the portion overlapping with and/or intersecting the line drawn from the bus line is electrically connected with the section of the inspection line which includes the portion other than the portion overlapping with and/or intersecting the line drawn from the bus line.

9. The production process according to claim 8 further comprising at least the steps of:
forming a gate bus line;
forming a gate insulating film;
forming a source bus line;
forming a passivation film; and
forming a pixel electrode,
wherein, concurrently in the step of the formation of the gate bus line, the line drawn from the bus line, and the section of the inspection line which includes the portion other than the portion overlapping with and/or intersecting the line drawn from the bus line are formed,
concurrently in the step of the formation of the gate insulating film, the first insulating film which covers the line drawn from the bus line and the section of the inspection line which includes the portion other than the portion overlapping with and/or intersecting the line drawn from the bus line is formed,
concurrently in the step of the formation of the source bus line, the section of the inspection line which includes the portion overlapping with and/or intersecting the line drawn from the bus line is formed, concurrently in the step of the formation of the passivation film, a second insulating film which covers the section of the inspection line which includes the portion overlapping with and/or intersecting the line drawn from the bus line is formed, and concurrently in the step of the formation of the pixel electrode, the conductor by which the section of the inspection line which includes the portion overlapping with and/or intersecting the line drawn from the bus line is electrically connected with the line drawn from the bus line, and the conductor by which the section of the inspection line which includes the portion overlapping with and/or intersecting the line drawn from the bus line is electrically connected with the section of the inspection line which includes the portion other than the portion overlapping with and/or intersecting the line drawn from the bus line are formed.

10. A process for producing a display panel comprising the production process according to claim 8.

* * * * *